(12) United States Patent
Castro

(10) Patent No.: US 11,522,014 B2
(45) Date of Patent: *Dec. 6, 2022

(54) CONNECTIONS FOR MEMORY ELECTRODE LINES

(71) Applicant: Micron Technology, Inc., Boise, ID (US)

(72) Inventor: Hernan A. Castro, Shingle Springs, CA (US)

(73) Assignee: Micron Technology, Inc., Boise, ID (US)

( * ) Notice: Subject to any disclaimer, the term of this patent is extended or adjusted under 35 U.S.C. 154(b) by 263 days.

This patent is subject to a terminal disclaimer.

(21) Appl. No.: 16/871,957

(22) Filed: May 11, 2020

(65) Prior Publication Data
US 2020/0343308 A1 Oct. 29, 2020

Related U.S. Application Data

(63) Continuation of application No. 16/057,603, filed on Aug. 7, 2018, now Pat. No. 10,686,015, which is a (Continued)

(51) Int. Cl.
*H01L 27/24* (2006.01)
*G11C 13/00* (2006.01)
*H01L 45/00* (2006.01)
*G11C 7/18* (2006.01)
*G11C 8/14* (2006.01)

(52) U.S. Cl.
CPC ...... *H01L 27/2481* (2013.01); *H01L 27/2427* (2013.01); *G11C 7/18* (2013.01); *G11C 8/14* (2013.01); *G11C 13/0004* (2013.01); *G11C 2213/71* (2013.01); *H01L 45/06* (2013.01); *H01L 45/1233* (2013.01); *H01L 45/144* (2013.01)

(58) Field of Classification Search
CPC . H01L 27/2481; H01L 27/2427; H01L 45/06; H01L 45/1233; H01L 45/144; G11C 7/18; G11C 8/14; G11C 13/0004; G11C 2213/71
See application file for complete search history.

(56) References Cited

U.S. PATENT DOCUMENTS 4,231,108 A 10/1980 Suzuki et al.
4,419,745 A 12/1983 Toyoda et al.
(Continued)

FOREIGN PATENT DOCUMENTS

EP 1237191 A2 9/2002

*Primary Examiner* — Nha T Nguyen
(74) *Attorney, Agent, or Firm* — Holland & Hart LLP

(57) ABSTRACT

Subject matter disclosed herein relates to an integrated circuit device having a socket interconnect region for connecting a plurality of conductive lines at a first vertical level to interconnect structures formed at a second vertical level different from the first vertical level. The conductive lines include a plurality of contacted lines that are vertically connected to the interconnect structures at the socket interconnect region, a plurality of terminating lines terminating at the socket interconnect region, and a plurality of pass-through lines that pass through the socket interconnect region without being vertically connected and without being terminated at the socket interconnect region.

20 Claims, 10 Drawing Sheets

Related U.S. Application Data continuation of application No. 14/637,158, filed on Mar. 3, 2015, now Pat. No. 10,074,693.

(56) References Cited

U.S. PATENT DOCUMENTS

| | | |
|---|---|---|
| 5,959,920 A | 9/1999 | Kiyota |
| 6,091,620 A | 7/2000 | Kablanian |
| 6,282,113 B1 | 8/2001 | Debrosse |
| 6,654,274 B2 | 11/2003 | Kang et al. |
| 6,816,404 B2 | 11/2004 | Khouri et al. |
| 6,870,757 B2 | 3/2005 | Hidaka |
| 7,453,150 B1 | 11/2008 | Mcdonald |
| 8,363,507 B2 | 1/2013 | Cho |
| 8,575,590 B2 | 11/2013 | Muraoka et al. |
| 8,598,579 B2 | 12/2013 | Chumakov et al. |
| 8,891,280 B2 | 11/2014 | Castro et al. |
| 9,025,398 B2 | 5/2015 | Flores et al. |
| 9,190,144 B2 | 11/2015 | Castro et al. |
| 9,224,635 B2 | 12/2015 | Pellizzer et al. |
| 9,361,976 B2 | 6/2016 | Siau et al. |
| 2002/0172067 A1 | 11/2002 | Kirihata et al. |
| 2007/0041235 A1 | 8/2007 | Inoue |
| 2011/0032785 A1* | 2/2011 | Cho .................. G11C 8/08 |
| | | 365/230.06 |
| 2011/0242885 A1 | 10/2011 | Kim |
| 2011/0261616 A1 | 10/2011 | Kim |
| 2016/0133320 A1* | 5/2016 | Siau .................. G11C 13/0023 |
| | | 365/148 |

\* cited by examiner

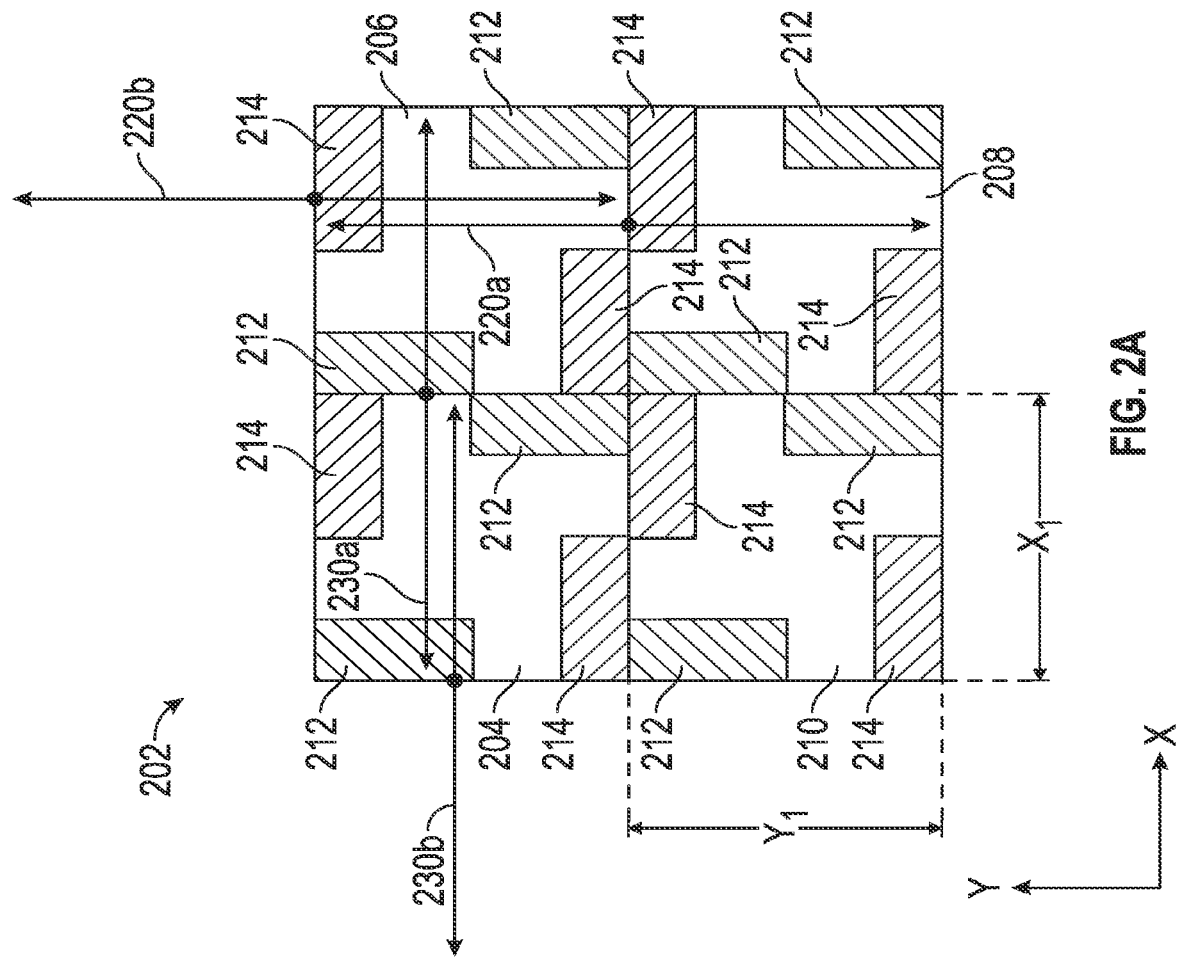
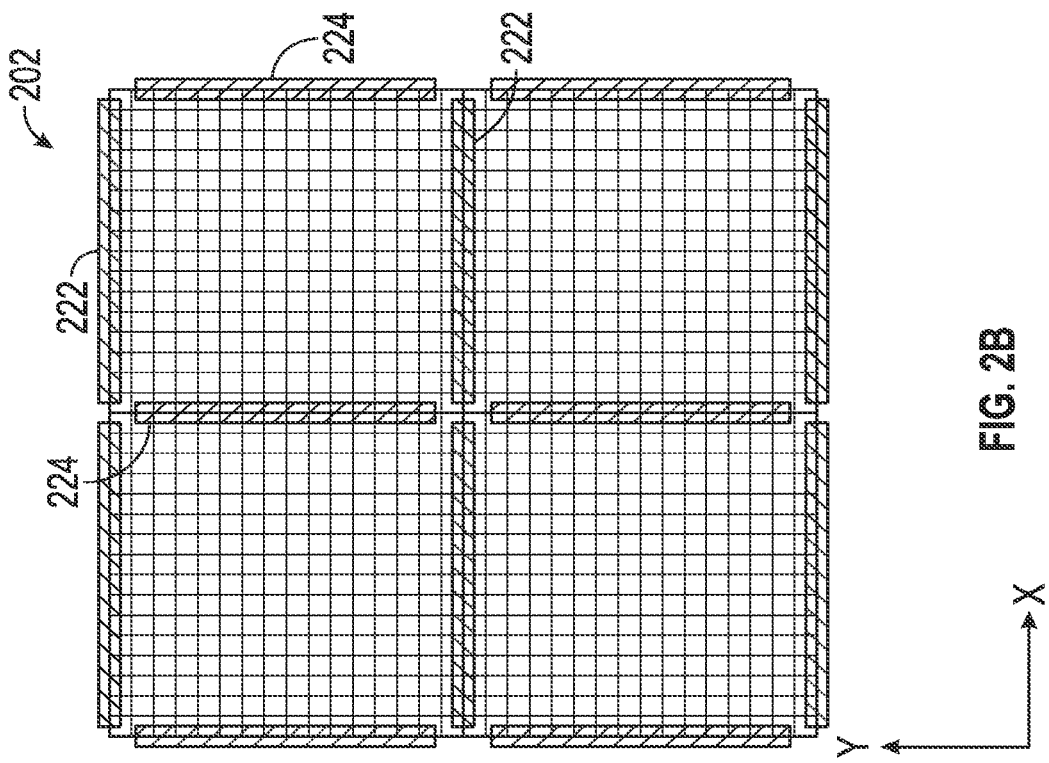
FIG. 2A
FIG. 2B

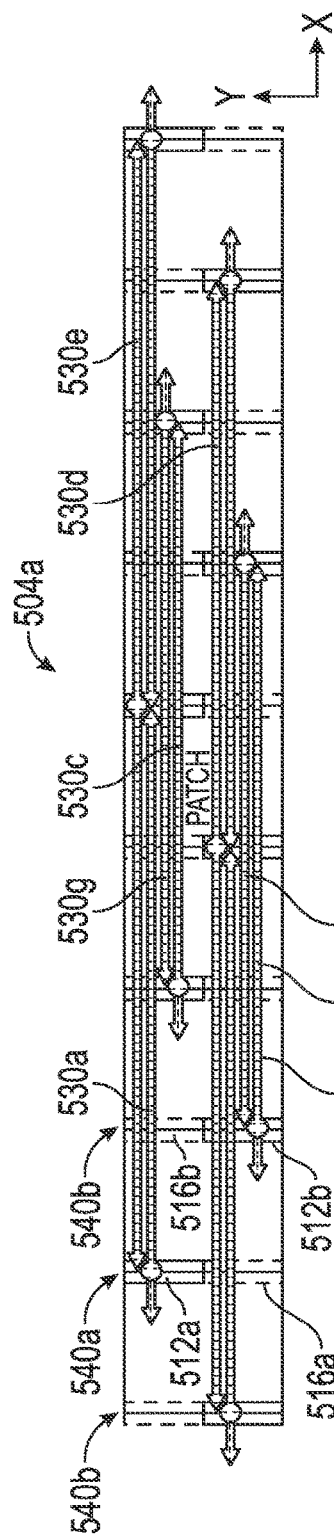
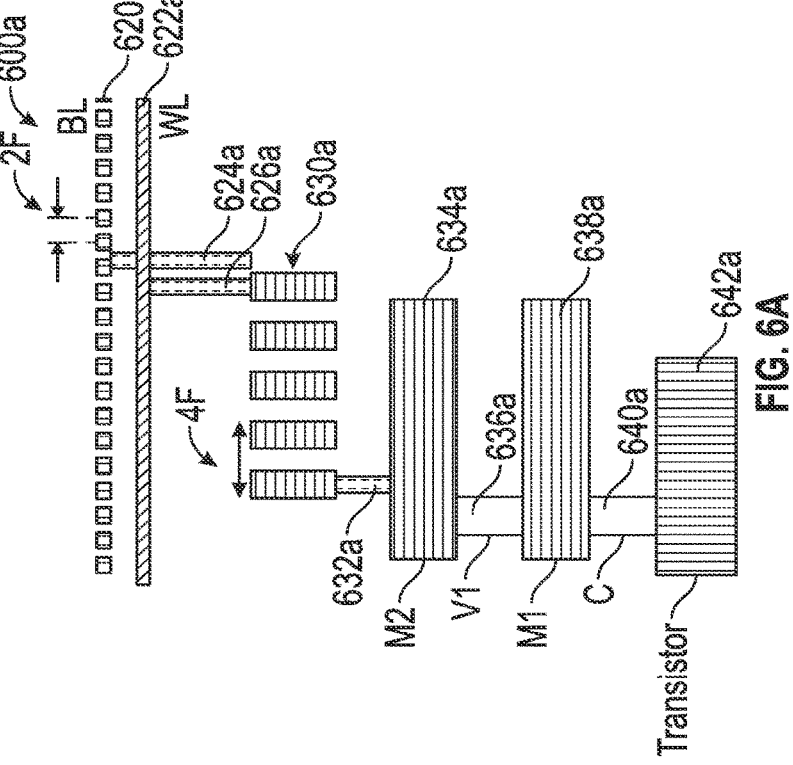

CONNECTIONS FOR MEMORY ELECTRODE LINES

CROSS REFERENCE

The present Application for Patent is a continuation of U.S. patent application Ser. No. 16/057,603 by Castro, entitled "Connection for Memory Electrode Lines," filed Aug. 7, 2018, which is a continuation of U.S. patent application Ser. No. 14/637,158 by Castro, entitled "Connection for Memory Electrode Lines," filed Mar. 3, 2015, each of which is assigned to the assignee hereof, and each of which is expressly incorporated by reference herein.

TECHNICAL FIELD

Embodiments of the present invention generally relate to integrated circuits and more specifically to architectures for cross-point memory devices.

BACKGROUND

There are many different types of memory, including random-access memory (RAM), read only memory (ROM), dynamic random access memory (DRAM), synchronous dynamic random access memory (SDRAM), resistive memory, and flash memory, among others. Types of resistive memory include phase change memory, programmable conductor memory, and resistive random access memory (RRAM), among others. Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices. Various resistive memory devices can include arrays of cells organized in a cross point architecture. In such architectures, the memory cells can include a cell stack comprising a storage element, e.g., a phase change element, in series with a select device, e.g., a switching element such as an ovonic threshold switch (OTS) or diode, between a pair of conductive lines, e.g., between an access line and a data/sense line. The memory cells are located at the intersections of word lines and bit lines and can be "selected" via application of appropriate voltages thereto.

BRIEF DESCRIPTION OF THE DRAWINGS

FIG. 2A is an illustration of one memory architecture in which an active memory array is partitioned into multiple sub-arrays with driver circuitry interspersed within the array region, according to one arrangement.

FIG. 2B is an illustration of socket interconnect regions for connecting word lines and bit lines of FIG. 2A to their drivers.

FIG. 5D is a close-up view of a plurality of sub-arrays of FIG. 5A illustrating adjacent electrode lines that are shifted with respect to each other, according to an embodiment.

FIG. 6A is a schematic cross-sectional view of a memory device illustrating vertical connections and metallization structures for the memory array architecture illustrated in FIGS. 3A-3C, according to one arrangement.

Figure 1A:
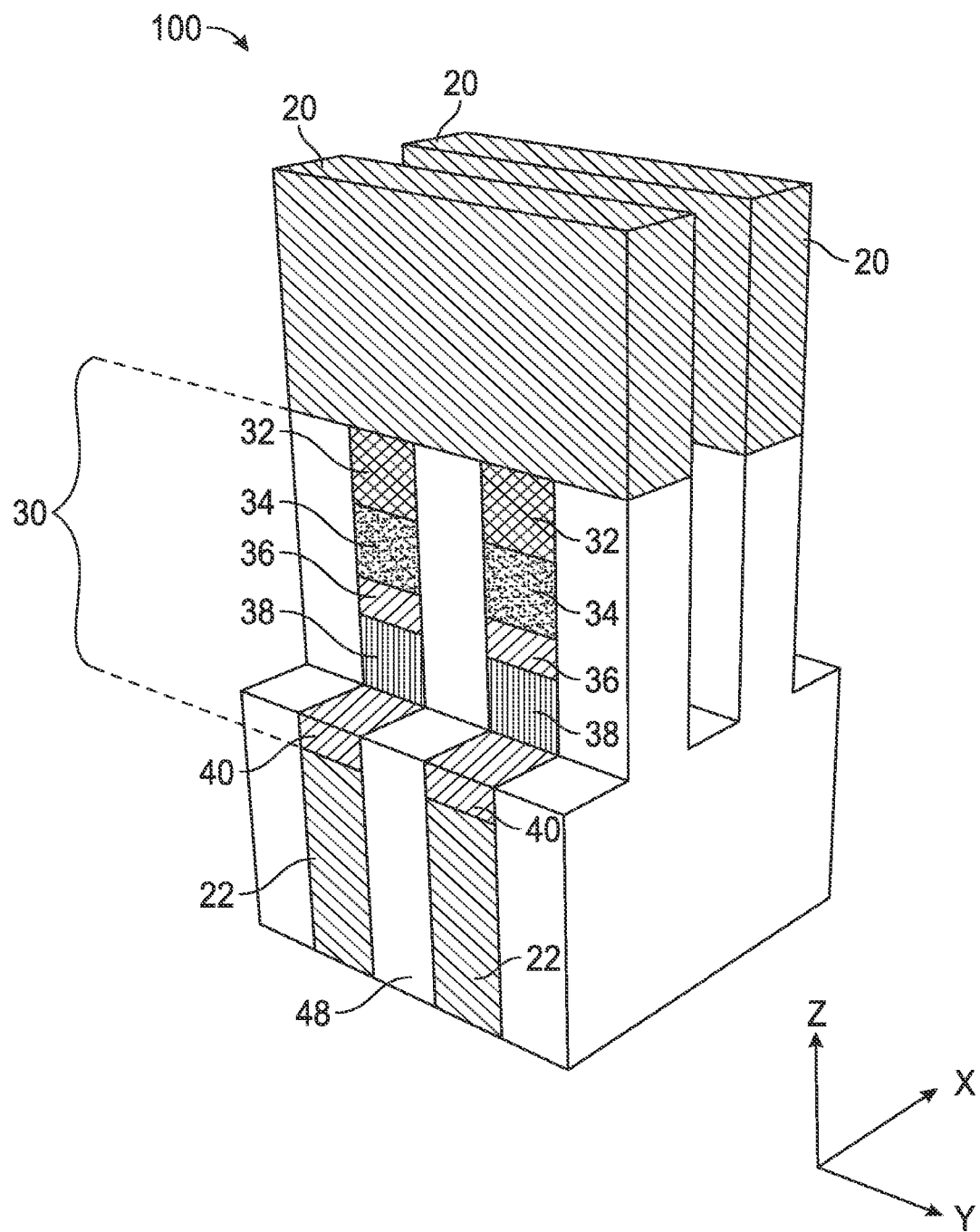
FIG. 1A is an isometric view of a portion of a deck of a memory array, according to embodiments.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized. Furthermore, structural and/or logical changes may be made without departing from the scope of claimed subject matter. It should also be noted that directions and/or references, for example, up, down, top, bottom, and so on, may be used to facilitate discussion of drawings and are not intended to restrict application of claimed subject matter. Therefore, the following detailed description is not to be taken to limit the scope of claimed subject matter and/or equivalents.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, methods, apparatuses and/or systems that would be known by one of ordinary skill have not been described in detail so as not to obscure claimed subject matter.

Integrated circuits, such as integrated circuit memory devices, include multiple layers of material typically built on a substrate. The material layers include metal and other highly conductive layers that are patterned into conductive lines and other circuit elements. Elongate conductive lines in an integrated circuit include interconnects; lines that also function as electrodes for semiconductor devices (e.g., switches and/or memory storage elements) can be referred to as electrode lines. Conductive lines formed from a layer or layers at the same vertical level can be referred to collectively as a metal level, though the material can be formed from non-metal conductors such as doped semiconductor layers (e.g., polysilicon) or metallic alloys such as metal nitrides, metal carbides and metal silicides. Contacts formed between metal levels can be referred to as vertical connectors or contact vias. Such vertical connectors can be formed separately from the lines they connect, or can be simultaneously formed with overlying conductive lines in a dual damascene process.

Furthermore, digit lines can be referred to as column electrodes, and references to digit line drivers and driver regions herein are more generally applicable to column drivers and driver regions. An example of a digit line is a "bit line." Similarly, word lines can be referred to as row electrodes, and references herein to word line drivers and driver regions are more generally applicable to row drivers and driver regions. The skilled artisan will appreciate that row and column electrodes need not be perpendicular; rather, an array can be configured in a manner in which the row and column electrodes cross one another at non-perpendicular angles.

In embodiments described herein, row and column driver regions (or word line and digit line driver regions) are described as including row driver circuits and column driver circuits. In addition to driver circuitry, the circuit level described below can include distributed or contiguous additional circuitry for operation of the memory array within the shared footprint with a memory array, such as global drivers, repeaters, write circuits, sense amplifiers, word decoders, digit decoders, etc. Collectively these circuits can be referred to as logic circuitry for the memory array. For example, digit line drivers, sense circuitry and digit decoders can be formed within column driver regions; word line drivers, word decoders, write circuits, global drivers and repeaters can be formed within column drivers. The skilled artisan will appreciate that different types of logic circuits can be distributed differently among the row and column driver regions described herein, and that in some embodiments the additional circuitry can be within the footprint of the memory array but outside the driver regions. Some types of logic circuitry can remain outside the footprint of the memory array.

A memory device may include an array of memory cells. A memory array generally includes two or more conductive, or semi-conductive, sets of orthogonal lines referred to as access lines, such as row electrodes in the form of word lines, and data/sense lines, such as column electrodes in the form of digit lines, that are used to program, erase, and read memory cells. Word lines and digit lines can also serve as electrodes for the memory cells. Although different types of memory cells may be programmed, erased, and read in different manners, word lines and digit lines are typically coupled to respective word line and digit line driver circuitry. As used herein, the term "substrate" may include silicon-on-insulator (SOI) or silicon-on-sapphire (SOS) technology, doped and undoped semiconductors, epitaxial layers of silicon supported by a base semiconductor foundation, complementary metal oxide semiconductors (CMOS), e.g., a CMOS front end with a metal backend, and/or other semiconductor structures and technologies. Various circuitry, such as decode circuitry, for example, associated with operating memory array may be formed in and/or on the substrate. Furthermore, when reference is made to a "substrate" in the following description, previous process steps may have been utilized to form regions or junctions in the base semiconductor structure or foundation.

FIG. 1A is an isometric view of a memory array 100 that may be included in an integrated circuit device. The memory array 100 is formed over a substrate (not shown, e.g., a silicon substrate), in which various circuitry, such as drivers and decode circuitry, associated with operating the memory array may be formed in and/or on the substrate. In addition, as described below with respect to FIGS. 6A-6C, the memory array 100 and the substrate may be electrically connected via one or more metallization layers which connect the various circuitry to the memory array 100.

In the illustrated embodiment, the memory array 100 is a cross point memory array having a plurality of variable resistance memory cells 30 at intersections between a plurality of column lines 20 extending in a y-direction and a plurality of row lines 22 formed extending in an x-direction. Each memory cell 30 is a variable resistance memory cell and can change between first and second resistance states in response to electrical signals. In the illustrated embodiment, each memory cell 30 has a cell stack comprising a storage element 34 and a selector element 38 that are configured to be electrically accessed through one of the column lines 20, which can be a digit line, and one of the row lines 22, which can be a word line. Each memory cell 30 further includes a first electrode 32 connecting the column line 20 and the storage element 34, a middle electrode 36 connecting the storage element 34 and the selector element 38, and a second electrode 40 connecting the selector element 38 and the row line 22. Adjacent memory cells 30 can be separated by isolation dielectrics 48. While only four memory cells 30 are depicted for clarity, it will be understood that the column lines 20 and row lines 22 can extend further to include an arbitrary number of memory cells 30.

In some embodiments, the variable resistance memory cell 30 is a phase change memory cell in which one or both of the selector element 38 and the storage element 34 can comprise chalcogenide materials. When both the selector element 38 and the storage element 34 comprise chalcogenide materials, the storage element 34 can comprise a chalcogenide material that can undergo a phase change that is stable and nonvolatile at room temperature. On the other hand, the selector element 38 can comprise a chalcogenide material that does not undergo a similar stable and nonvolatile phase change. When the storage element 34 includes a chalcogenide material, the variable resistance memory cell 30 may be referred to as a phase change memory cell.

Examples of chalcogenide materials included in the storage element 34 include chalcogenide compositions such as an alloy including at least two of the elements within the indium(In)-antimony(Sb)-tellurium(Te) (IST) alloy system, for example, In2Sb2Te5, IniSb2Te4, IniSb4Te7, etc., or an alloy including at least two of the elements within the germanium(Ge)-antimony(Sb)-tellurium(Te) (GS T) alloy system, for example, Ge8Sb5Te8, Ge2Sb2Te5, GeiSb2Te4, GeiSb4Te7, Ge4Sb4Te7, etc. Other chalcogenide alloy systems that can be included in the storage element 34 include Ge—Te, In—Se, Sb—Te, Ga—Sb, In—Sb, As—Te, Al—Te, In—Ge—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. The hyphenated chemical composition notation, as used herein, indicates the elements included in a particular mixture or compound, and is not intended to represent a particular stoichiometry involving the indicated elements.

Examples of chalcogenide-based selector element 38 include a two-terminal selector comprising a chalcogenide material, which is sometimes referred to as an Ovonic Threshold Switch (OTS). An OTS may include a chalcogenide composition including any one of the chalcogenide alloy systems described above for the storage element 34. In addition, the selector element 38 may further comprise an element such as to suppress crystallization. Examples of OTS materials include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se, among others.

Examples of non-chalcogenide-based selector elements include a two terminal device (e.g., a switch), such as a diode, an ovonic threshold switch (OTS), a tunnel junction, or a mixed ionic electronic conduction switch (MIEC), among other two terminal devices. Alternatively, examples of the selector element include a three terminal device (e.g., a switch), such as a field effect transistor (FET) or a bipolar junction transistor (BJT), among other switching elements.

One advantage of cross point memory arrays such as the memory array 100 described above with respect to FIG. 1A is that arrays of memory cells can be physically stacked on top of one another, such that the physical density of memory cells can be increased, e.g., doubled, tripled, quadrupled, etc., without incurring additional lateral array footprint. In the following, a stack of memory cells electrically addressable by two sets of conductive lines, e.g., digit lines and word lines, is referred to herein as a "deck."

Figure 1B:
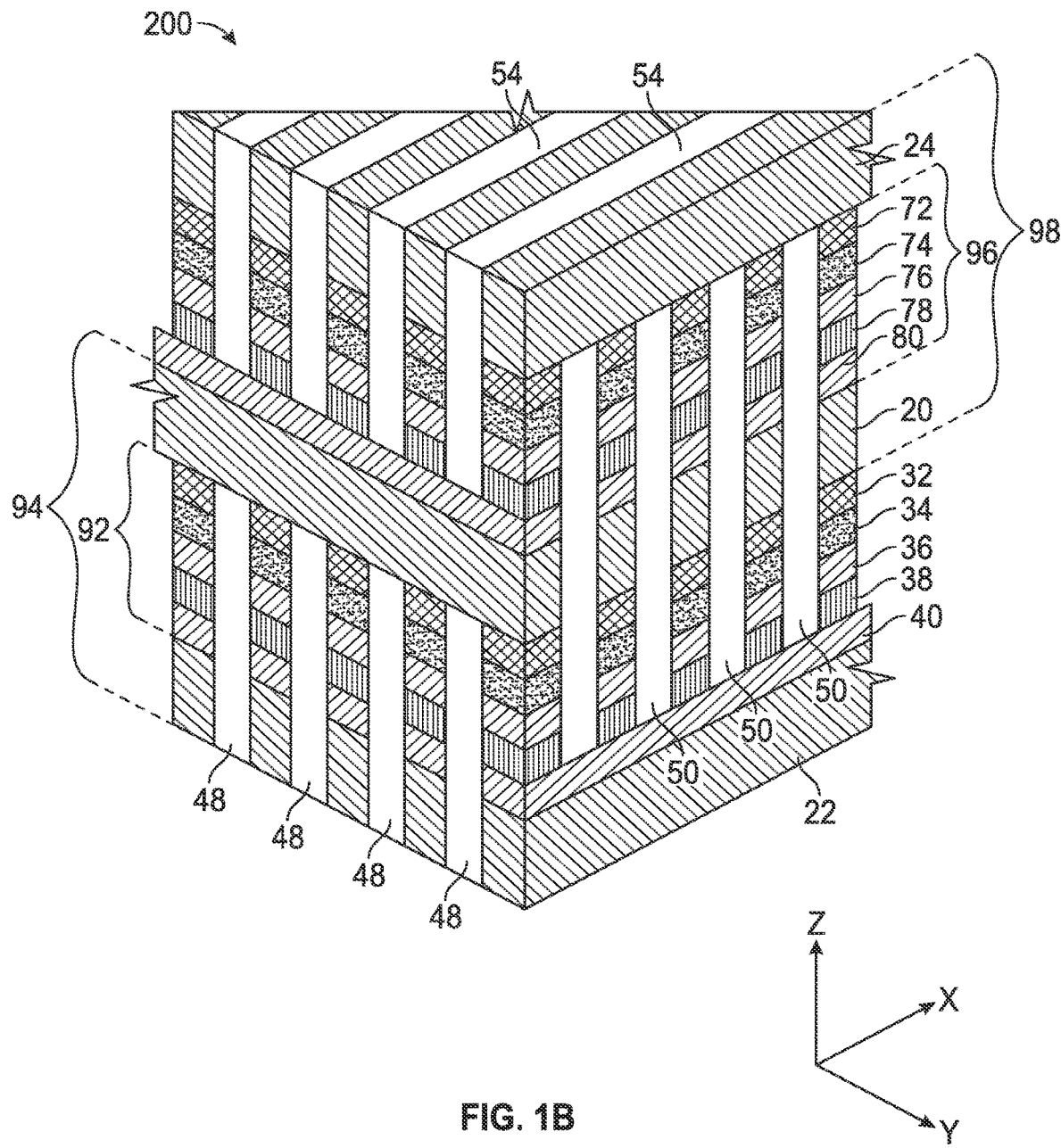
FIG. 1B is an isometric view of a portion of a dual-deck memory array, according to embodiments.

FIG. 1B is an isometric view of a dual-deck memory array 200, which may be a dual-deck variable resistance memory array 200, which includes a lower deck 94 and an upper deck 98. The lower deck 94 includes first conductive lines 22 extending in an x-direction, in a similar manner to the lower conductive lines 22 of FIG. 1A, and second conductive lines 20 extending in a y-direction in a similar manner to the upper conductive lines 20 of FIG. 1A. Similar to FIG. 1A, the lower deck 94 further includes a plurality of lower variable resistance memory cells 92 formed on the first conductive lines 22. Adjacent variable resistance memory cells 92 can be separated in the y-direction and in the x-direction by isolation dielectrics 48 and 50, respectively. For illustrative purposes, the lower variable resistance memory cells 92 will be described herein as phase change memory cells, but other variable resistance memory cells can be used in other arrangements, as described above. The lower phase change memory cells 92 include a first lower electrode line 40 extending in the x-direction, a first lower chalcogenide element 38 disposed on the first lower electrode line 40, a first middle electrode 36 disposed on the first lower chalcogenide element 38 (e.g., a selector node), a first upper chalcogenide element 34 (e.g., a storage node) on the first middle electrode 36, and a first upper electrode 32 disposed on the first upper chalcogenide element 34.

In the illustrated dual-deck memory array 200, the upper deck 98 shares common conductive lines with the lower deck 94 as access lines. The upper deck 98 includes the second conductive lines 20 extending in the y-direction that are shared as access lines with the lower deck 94, and further includes third conductive lines 24 extending in the x-direction. Upper variable resistance memory cells 96 are disposed on the second conductive lines 20. Each upper variable resistance memory cell 96 include a second lower electrode line 80 extending in the y-direction, a second lower chalcogenide element 78 disposed on the second lower electrode line 80, a second middle electrode 76 disposed on the second lower chalcogenide element 78 (e.g., a selector node), a second upper chalcogenide element 74 (e.g., a storage node) on the second middle electrode 76, and a second upper electrode 72 disposed on the second upper chalcogenide element 74. Adjacent upper variable resistance memory cells 96 can be separated in the y-direction and in the x-direction by isolation dielectrics 54 and 50, respectively.

In addition to being configurable as a plurality of decks of memory arrays for multiplying the physical bit density by the number of decks, because one or more decks of memory cell stacks 200 described above can be formed above the substrate, various support circuitry, such as decode circuitry and/or driver circuitry associated with operating the memory array, may be disposed under the memory array. As a result, the amount of independent lateral footprint occupied by the support circuitry may be dramatically reduced or even eliminated, compared to exclusively peripherally located support circuitry, thereby increasing the overall array layout efficiency, according to various embodiments disclosed herein. Furthermore, according to various embodiments described herein, the support circuitry may be arranged in an interlaced or interweaved pattern under the memory array such that socket connections for electrically connecting the array electrode lines, e.g., word lines and digit lines, to the underlying support circuitry can be formed using reduced criticality of lithography processes, while improving electrical access performance, e.g., reducing RC delay of the electrode lines, and improving efficiency of connections to electrode lines of different decks.

FIG. 2A illustrates a memory architecture in which word line drivers 212 and digit line drivers 214 are distributed and disposed substantially within the foot print of the active array, e.g., disposed under and overlapping the memory cells of the memory array, according one arrangement. It will be understood that each shaded area comprises a region that can include multiple driver circuits, e.g., multiple units of CMOS circuits. FIG. 2A depicts one of repeating memory array units, referred to herein as a tile 202 of memory array. As shown, the tile 202 has at least one word line 230a traversing substantially an entire width of the tile 202 in the x-direction before terminating at or within word line socket interconnect regions 224 (described below with respect to FIG. 2B) disposed at opposing edges of the tile 202 extending the y-direction. Similarly, the tile 202 has at least one digit line 220a traversing substantially an entire length of the tile 202 in the y-direction before terminating at or within digit line socket interconnect regions 222 (described below with respect to FIG. 2B) disposed at opposing edges of the tile 202 extending in the x-direction. In some embodiments, the tile 202 can have CMOS decoders within its footprint that are used to select each distinct word line (230a, 230b) and each distinct digit line (220a, 220b) that are disposed within the tile.

The tile 202 of memory array in FIG. 2A is divided into four sub-units (quadrants), referred to herein as patches 204, 206, 208 and 210 of the tile 202 of memory array. In the illustrated embodiment, each word line (230a, 230b) traverses two patches (204 and 206 or 208 and 210) in the x-direction before terminating and each digit line (220a, 220b) traverse two patches (204 and 210 or 206 and 210) in the y-direction before terminating. Two patches traversed by a word line or a digit line can be of adjacent tiles 202.

In the tile 202 of FIG. 2A, each patch in a plan view is identical to a neighboring patch such that adjacent patches have corresponding word line drivers 212 and digit line drivers 214 that repeat in x- or y-directions. The word line drivers 212 are in the upper left and lower right corners of each patch, and extend generally along the edges extending in the y-direction to connect with word lines 230a and 230b extending in the x-direction. The digit line drivers 214 are in the upper right and lower left corners of each patch, and extend generally along the edges extending in the x-direction to connect with digit lines 220 extending in the y-direction. In an example PCM array, the four patches 204, 206, 208 and 210 can occupy the same footprint as between about 100 thousand and 16 million memory cells, depending on the number of decks of memory each tile includes. The digit line drivers 214 and word line drivers 212 are typically formed within the semiconductor substrate below the digit lines 220 and word lines 230. The socket interconnect regions, described below, are the regions in which the digit lines 220 and word lines 230 are connected to interconnect circuitry, and thus indirectly to the drivers.

Other non-repeating patch arrangements are possible, where adjacent patches do not repeat the patterns of the drivers but can be symmetric "mirror images." Examples of such arrangements are described with respect to FIGS. 3A-3C, 4A-4C and 5A-5D. For example, patches 204 and 206 can be minor-symmetric to each other about the mutual boundary extending in the y-direction. In such configurations, the lower ones of the two word line drivers 212 of the patches 204 and 206 would be immediately adjacent each other while the upper ones of the two word line drivers 212 would be disposed at the two opposing sides of the tile 202 that extend in the x-direction. In the illustrated embodiment, each of the patches 204, 206, 208, 210 has a width X1 in the x-direction and a length Y1 in the y-direction.

Still referring to FIG. 2A, word line drivers 212 may be coupled to a central location of each word line 230a/230b, which may cross boundaries between adjacent patches. The word lines 230a, 230b can have generally the same length, e.g., 2X1, as illustrated. As indicated by a dot along each word line 230a/230b, a socket, which represents a connection point between the word line 230a/230b to its driver 212 (typically indirectly through interconnect lines) is generally positioned centrally, e.g., closer to a mid-point along the word line 230a/230b than to either end point (indicated by an arrow head) of the word line 230a/230b. In some implementations, the socket is positioned a distance of at least 40% of the length of the word line 230a/230b from either end of the word line 230a/230b, i.e., along the middle 20% of the length of the word line. The total number of digits, e.g., bits, coupled to a physical word line may be the same as a conventional end-connected word line, and can be the same for each word line in the array, although the distance to the terminal point of the word line from the driver interconnect may vary.

The digit line drivers 214 are coupled to central location of each digit line 220a/220b, in a similar manner as described above with respect to the word lines 230a/230b. Similar to word lines 230a/230b, the digit lines 220a, 220b cross boundaries between adjacent patches and can generally have the substantially the same length, e.g., 2Y1. Further similar to the word lines, each digit line 220a/220b can be connected to its driver 214 (typically indirectly through interconnect lines) by a socket, represented by a dot, that is positioned centrally along the digit line, e.g., closer to a mid-point of the digit line than to either end points, or e.g., positioned a distance of at least 40% of the length of the digit line from either end of the digit lines, i.e., along the middle 20% of the length of the word line. The total number of digits, e.g., bits, coupled to a physical digit line may be the same as a conventional end-connected digit line, and can be the same for each digit line in the array, although the distance to the terminal point of the word line from the driver interconnect may vary.

It will be appreciated that the driver circuits can be reversed, for example the word line drivers can be in the lower left and upper right corners of the patches, as long as all patches have the same layout.

FIG. 2B illustrates socket interconnect regions 224 for the word lines and socket interconnect regions 222 for the digit lines of the array architecture of FIG. 2A. It is noted that the socket interconnect regions are disposed at the boundaries of each of the patches 204, 206, 208 and 210 and can partially overlap edge regions of adjacent neighboring patches. That is, a common word line socket interconnect region 224 extends in the y-direction and is disposed between two patches that are adjacent each other in the x-direction, e.g., patches 204 and 206, or patches 208 and 210. Similarly, a common digit line socket interconnect region 222 extends in the x-direction and is disposed between two patches that are adjacent each other in the y-direction, e.g., patches 204 and 210, or patches 206 and 208.

From a frame of reference of the tile 202, FIGS. 2A and 2B illustrate two types of word lines 230a and 230b and two types of digit lines 220a and 220b. The word lines 230a are centrally connected at or within one of the inner word line socket interconnect regions 224, and terminate at or within one of the outer word line socket interconnect regions 224 formed along the edge regions of the tile 202 that extend in the y-direction. The word lines 230b are centrally connected at or within one of the outer word line socket interconnect regions 224 formed along the edge regions of the tile 202 that extend in the y-direction, and terminate at or within one of the inner word line socket interconnect regions 224. As a result, the word lines 230a/230b are either connected or terminate at or within one of the word line socket interconnect regions 224, while no word line 230a/230b passes through any of the word line socket interconnect regions 224 without connection or termination.

Similarly, the digit lines 220a are centrally connected at or within one of the inner digit line socket interconnect regions 222, and terminate at or within one of the outer digit line socket interconnect regions 222 formed along the edge regions of the tile 202. The digit lines 220b are centrally connected at or within one of the outer digit line socket interconnect regions 222 formed along the edge regions of the tile 202 that extend in the x-direction, and terminate at or within one of the inner digit line socket interconnect regions 222. As a result, the digit lines 220a/220b are either connected or terminate at or within one of the digit line socket interconnect regions 222, while no digit line 220a/

220b passes through any of the digit line socket interconnect regions 222 without connection or termination.

It has been found that, by increasing the degree of subdivision of a memory tile into patches and having different degrees of interlacing or offsetting of electrode lines, certain advantages can be achieved, e.g., looser lithographic requirements for interconnect structures that connect the electrode lines to metallization levels below the memory array. In the following, with respect to embodiments of FIGS. 3A-3C, 4A-4C and 5A-5D, various arrangements of tiles of memory arrays that are subdivided into patches at varying degrees are disclosed. Socket interconnect regions serve as connecting regions for connecting a plurality of electrode lines formed at a first vertical level to interconnect structures formed at a vertical level different from, e.g., lower than, the vertical level at which the electrode lines are formed. In some arrangements, the electrode lines include a plurality of contacted lines that are vertically connected to the interconnect structures at a socket interconnect region (FIGS. 3A-3C, 4A-4C and 5A-5D). In some other arrangements, the electrode lines additionally include a plurality of terminating lines terminating at the socket interconnect region (FIGS. 4A-4C and 5A-5D). In some embodiments, the electrode lines additionally includes a plurality of pass-through lines that pass through the socket interconnect region without being vertically connected and without being terminated at the socket interconnect region (FIGS. 5A-5D).

In some embodiments, as described in more detail below with respect to FIGS. 5C and 5D, each of the conductive lines is connected at a respective socket interconnect region to the interconnect structures, wherein at least one of the conductive lines is connected at a first socket interconnect region and at least another one of the electrode lines is connected at a second socket interconnect region that is shifted in the first direction relative to the first socket interconnect region by less than about one quarter of a length of the electrode lines, for instance between about 5% and about 20% of a length of the electrode lines.

In various arrangements described more in detail below with respect to FIGS. 3C, 4C and 5C, a plurality of electrode lines, e.g., parallel lines, extend in a first direction (e.g., x-direction) and have regular line widths and widths of spaces between the lines such that the lines have a first pitch in the second direction (e.g., y-direction) crossing the first direction. Each electrode line is connected to interconnect structures disposed at a vertical level different from the vertical level of the electrode lines at a respective vertical connection position, e.g., metallization levels below the level of the electrode lines.

As will be explained in more detail in reference to FIGS. 5D and FIGS. 6A-6C, in various arrangements, the vertical connection positions along the first direction of some electrode lines may be shifted relative to one another in the first direction, while the vertical connection positions along the first direction of some other electrode lines may be disposed at a similar or the same vertical connection positions and not be shifted relative to one another in in the first lateral direction. In addition, the similar or the same vertical connection positions may periodically repeat in the second direction at a periodicity that is greater than the first pitch, e.g., greater than at least three times the first pitch, for instance four times the first pitch or eight times the first pitch. For example, in some embodiments, each electrode line may have a vertical connection position that is shifted in the x-direction with respect to an immediately adjacent electrode line by a fraction, e.g., ¼, ⅛, 1/16, etc., of the electrode line length. In addition, successive adjacent lines may continue to shift in a regular pattern in the second direction, such that two electrode lines separated by a number of intervening lines may have the same vertical connection position in the x-direction. For example, where immediately adjacent electrode lines are successively shifted in the x-direction by ¼, ⅛ and 1/16 of the electrode line length, the vertical connection positions may be repeated in the y-direction every 4, 8 and 16 lines, respectively. In these arrangements, the electrode lines have a pitch of 2F, the corresponding periodicity of the vertical connection positions in the y-direction would be 8F, 16F and 32F, respectively. In other embodiments, immediately adjacent lines are shifted by different multiples of a fraction of the electrode line length. In some other embodiments, instead of individual lines being shifted relative to one another, groups of lines, e.g., pairs of lines, may be shifted relative to one another, e.g., in the case where the lines are patterned by a pitch multiplication technique. For example, each pair of electrode lines may have a vertical connection position that is shifted in the x-direction with respect to an immediately adjacent pair of electrode lines by a fraction, e.g., ¼, ⅛, 1/16, etc., of the electrode line length. In these embodiments, immediately adjacent pairs of electrode lines are shifted in the x-direction by ¼, ⅛ and 1/16 of the electrode line length, such that the vertical connection positions may be repeated in the y-direction every 16, 32 and 64 lines, respectively.

As described herein, in some embodiments, an electrode line which extends in a given direction can include jogs or kinks within the line. The direction of such line, however, generally begins and ends in the same direction and the jogs are only short deviations from the general direction of extension. Such jogs are illustrated, for example, in US Patent Publication No. 2014-0239512, published on Aug. 28, 2014.

Varying degrees of subdivision can be utilized to optimize the socket interconnection to an underlying driver region. In each of the arrangements, while not shown for clarity, it will be understood that a word line driver is located substantially within the foot print of active array, e.g., near the edges of a patch, in a similar manner as described above with respect to FIGS. 2A and 2B. Similarly, it will be understood that a digit line driver is located substantially within the foot print of active array, e.g., near the edges of a patch, in a similar manner as described above with respect to FIGS. 2A and 2B. In addition, while not illustrated, it will be understood that each socket interconnect region at least partially overlaps a corresponding driver region, in a similar manner as illustrated above with respect to FIGS. 2A and 2B, but maybe be shifted from the horizontal location of the corresponding socket region by connection through multiple levels of interconnect metallization. In addition, it will be understood that each shaded area comprises a region that can include multiple driver circuits.

In the following with respect to FIGS. 3A, 4A and 5A, while a single tile is illustrated, in practice any number of tiles can be joined together to form a larger memory array. In each of the arrangements of memory tiles described below with respect to FIGS. 3A-3C, 4A-4C and 5A-5D, each patch of a memory tile comprises a "mirror copy" of an adjacent patch, in contrast to the memory patches described with respect to FIG. 2A. In each of the arrangements, word line socket interconnect regions are disposed in the lower left and upper right corners of each patch and extend generally in the y-direction, and digit line socket interconnect regions are disposed in the upper left and lower right corners of each patch and extend generally in the x-direction. In each of the memory tiles described below with respect to FIGS. 3A-3C, 4A-4C and 5A-5D, a digit line spans a length of 2Y1 that is equivalent to a length in the y-direction of one tile, and a word line spans a length of 2X1 that is equivalent to a width in the x-direction of one tile. In other words, the dimensions of the tile are defined as equal to the lengths of the words lines and digit lines. However, in each of the memory tiles described below with respect to FIGS. 3A-3C, 4A-4C and 5A-5D, the number of patches spanned by a digit line in the x-direction and the number of patches spanned by a word line in the y-direction are different, as described below. In each of FIGS. 3A-3B, 4A-4B and 5A-5B, in a similar manner as described in FIG. 2A, vertical connection locations within a socket region, of word lines and digit lines are indicated by dots, and termination locations of word lines and digit lines are indicated by arrow heads. In each of FIGS. 3A-3B, 4A-4B and 5A-5B, in a similar manner as described above with respect to FIG. 2A, while a single double-sided arrow may be used to designate a word line or a digit line, it will be understood that there is a plurality of similar word lines or digit lines within a given socket interconnect region. As described herein, a main array region refers to a region of memory array where electrode lines of different types, e.g., the digit lines and word lines, cross each other to form memory cells. A gap region, also referred to herein as a boundary region, refers to a region between main array regions in which electrode lines of different types do not cross each other. A gap region can include an electrode socket interconnect region and a terminating electrode line region and/or a pass-through electrode line region. The electrode socket interconnect region and the terminating electrode line region and/or the pass-through electrode line region may be laterally adjacent to each other. An electrode socket interconnect region includes a plurality of vertically connected lines. A terminating electrode line region does not include vertically connected lines and includes electrode lines terminating therein. A pass-through electrode line region does not include vertically connected lines and includes electrode lines that pass therethrough.

Figure 3A:
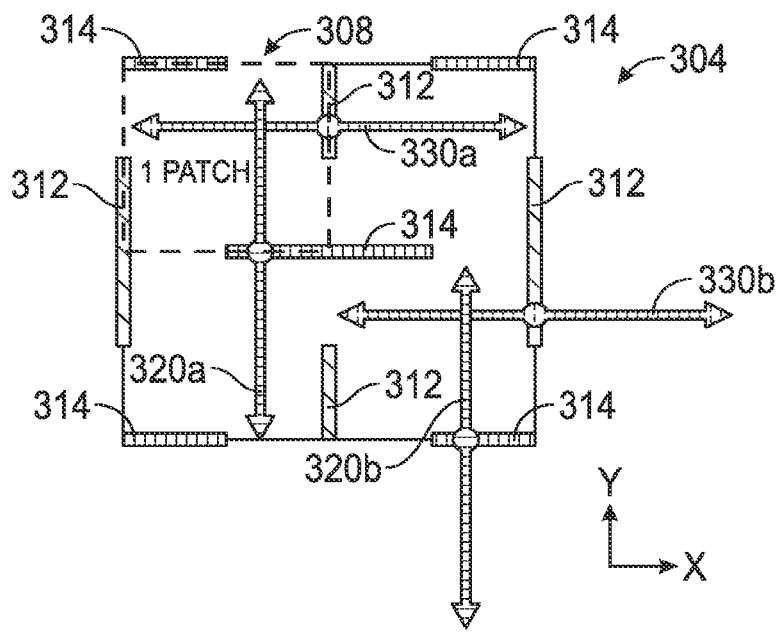
FIG. 3A is an illustration of one array architecture having an active memory array partitioned into multiple sub-arrays with socket interconnect regions interspersed within the active memory array, according to another arrangement.
Figure 3B:
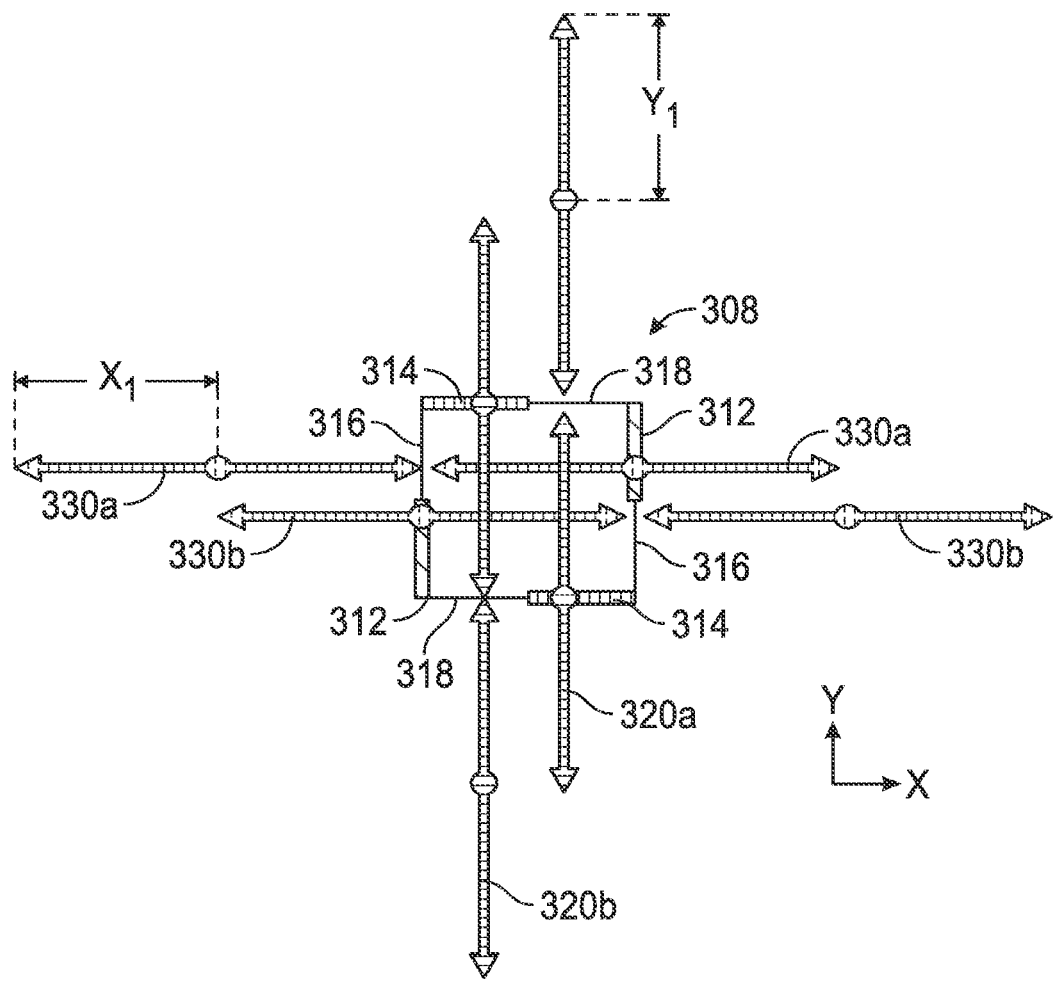
FIG. 3B is a more detailed illustration of one of the sub-arrays of the array of FIG. 3A with socket interconnect regions interspersed within the active memory array.

FIG. 3A illustrates a tile 304 of memory array divided into four (2×2) patches 308, and FIG. 3B illustrates one of the patches 308 of the tile 304, according to some arrangements. From a frame of reference of the illustrated tile 304, FIGS. 3A and 3B illustrate two types of word lines. Word lines 330*a* are vertically connected at their respective central locations at or within one of inner word line socket interconnect regions 312 located in the upper and lower middle regions of the tile 304. Word lines 330*b* are vertically connected at their respective central locations at or within one of outer word line socket interconnect regions 312 located in the left and right middle edge regions of the tile 304, which are shifted in the x-direction by about ½ of a length of the word lines, e.g., by X1, and further shifted in the y-direction by about ½ of a length of the digit lines, e.g., by Y1. In the tile 304, each digit line 320*a/b* spans between one and three patches 308 in the y-direction, for instance about two patches 308, while each word line 330*a/b* spans between one and three patches 308 in the x-direction, for instance about two patches 308. Unlike the word lines of FIG. 2A, the word lines 330*a* and 330*b* do not terminate at or within another one of one of the word line socket interconnect regions. Instead, the word lines 330*a* and 330*b* terminate within a terminating word line region 316 (FIG. 3B) between adjacent patches and outside the word line socket interconnect regions 312. Similarly, FIGS. 3A and 3B illustrate two types of digit lines. Digit lines 320*a* are vertically connected at their respective central locations at or within the inner digit line socket interconnect region 314 located in the central region of the tile 304. Digit lines 320*b* are vertically connected at their respective central locations at or within the outer digit line socket interconnect regions 314 at upper right, upper left, lower right and lower left regions of the tile 304. Unlike the digit lines of FIG. 2A, the digit lines 330*a* and 330*b* do not terminate at or within another one of one of the digit line socket interconnect regions. Instead, the digit lines 330*a* and 330*b* terminate within a terminating digit line region 318 (FIG. 3B) that is outside the digit line socket interconnect regions and outside the main array regions.

In some arrangements, within a given patch 308, word lines 330*a* comprise about half the word lines, and word lines 330*b* comprise a remainder of the word lines. Similarly, in some embodiments, digit lines 320*a* comprise about half the digit lines, and digit lines 320*b* comprise a remainder of the digit lines.

Figure 3C:
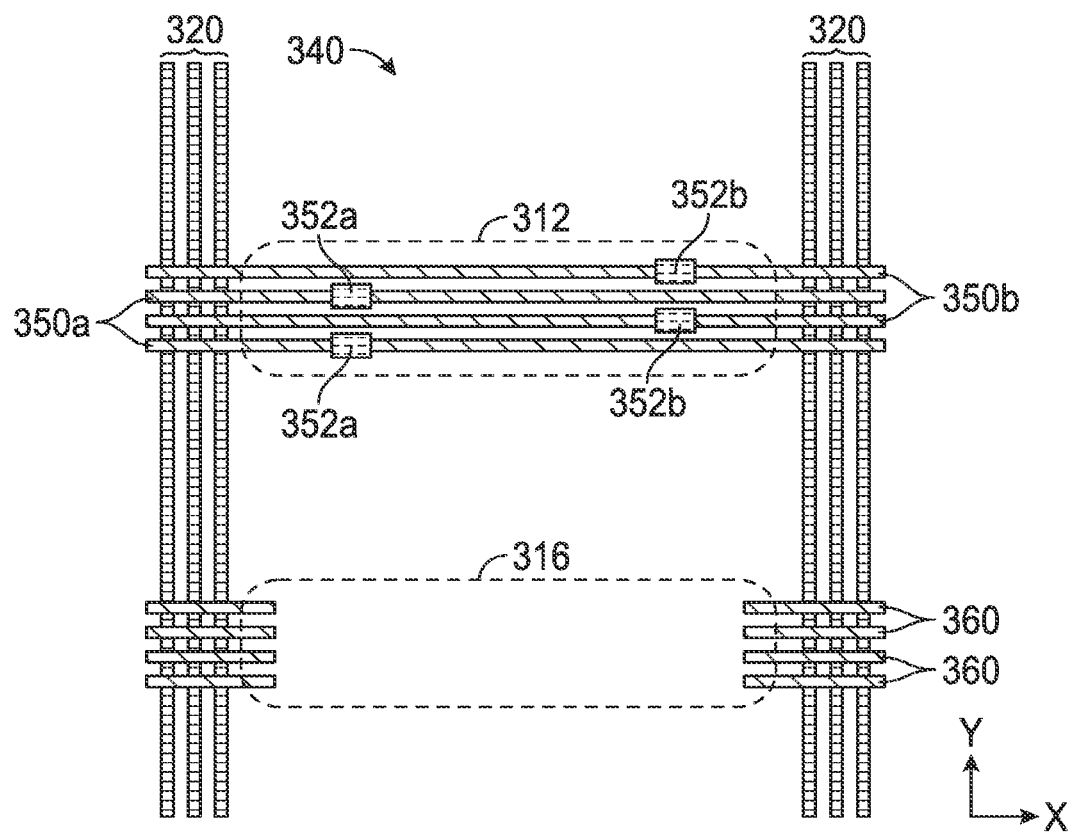
FIG. 3C is a close-up view of a gap region including a socket interconnect region of the array architecture of FIG. 3A.

FIG. 3C illustrates a detailed view of a boundary region 340 between main array regions of adjacent patches 308 in the x-direction, for the architecture described with respect to FIGS. 3A-3B. The boundary region 340 includes a word line socket interconnect region 312 and a terminating word line region 316. The boundary region 340 is formed between main array regions of adjacent patches. Main array regions include memory cells formed at intersections between left and right groups of digit lines 320 and word lines 350*a*/350*b* that are vertically connected at their respective connection locations 352*a*/352*b*, e.g., respective central locations, within the socket interconnect region 312, and at intersections between left and right groups of digit lines 320 and word lines 360 that are terminated within the terminating word line region 316. The word lines 350*a* and 350*b* that are vertically connected within the word line interconnect socket region 312 can correspond to one of the word lines 330*a* or 330*b* of FIGS. 3A and 3B, and word lines 360 that terminate within the terminating word line region 316 can correspond to the other of the word lines 330*a* or 330*b* of FIGS. 3A and 3B. For illustrative purposes only, only a few digit lines 320 and a few of each group of word lines 350*a*/350*b* and 360 are illustrated.

Still referring to FIG. 3C, in the socket interconnect region 312, the connection locations 352*a* and 352*b* of vertically connected word lines 350*a* and 350*b* are staggered, or offset in the x-direction relative to each other. It will be appreciated that the staggered arrangement can provide margin of error for the vertical connections. For example, when the vertical connections are made using via structures, a lateral dimension in the y-direction of the via structures can be greater than a pitch of the word lines in the y-direction without creating an electrical short between adjacent word lines. In the terminating word line region 316, all word lines 360 terminate. The bundle of terminated word lines 360 on the left side are vertically connected at their respective connection locations that are located at a distance of Xi to the left of the terminating word line region 316 as described above with respect to FIGS. 3A and 3B, and the bundle of terminated word lines 360 on the right side are vertically connected at their respective connection locations that are located at a distance of half of length of the word lines, e.g., Xi, to the right side of the terminating word line region 316 as described above with respect to FIGS. 3A and 3B.

While not illustrated, the tile 304 includes boundary regions between adjacent patches in the y-direction, each of which includes a digit line socket interconnect region and a terminating digit line region, in an analogous manner as described above with respect to the boundary region 340 between two adjacent patches in the x-direction. As with the word lines, vertical connections for the digit lines are made at connection locations (not shown) in a digit line socket interconnect region, and those connection locations can also be staggered. Also as with the word lines, at or within each terminating digit line region, all lines terminate (not shown).

Figure 4A:
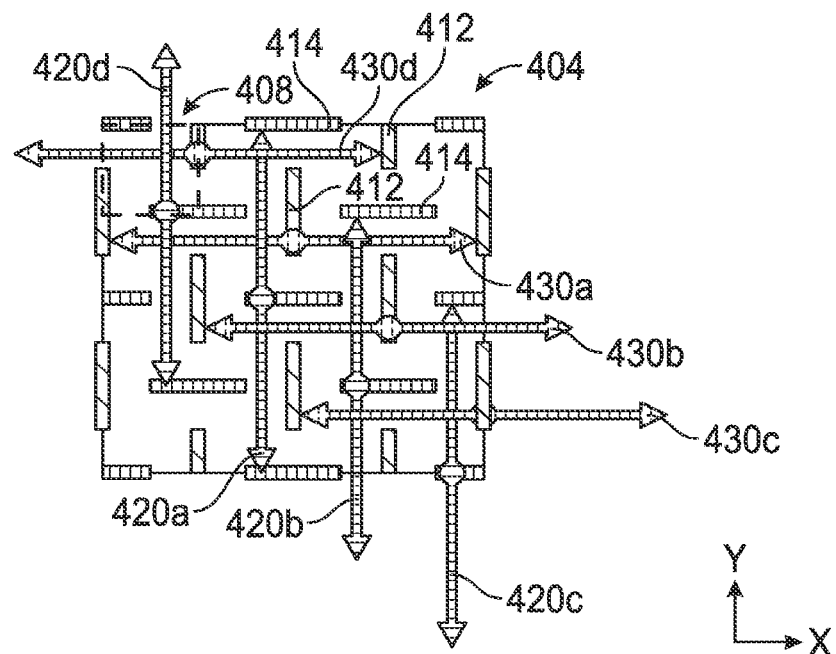
FIG. 4A is an illustration of one array architecture having an active memory array partitioned into multiple sub-arrays with socket interconnect regions interspersed within the active memory array, according to another arrangement.
Figure 4B:
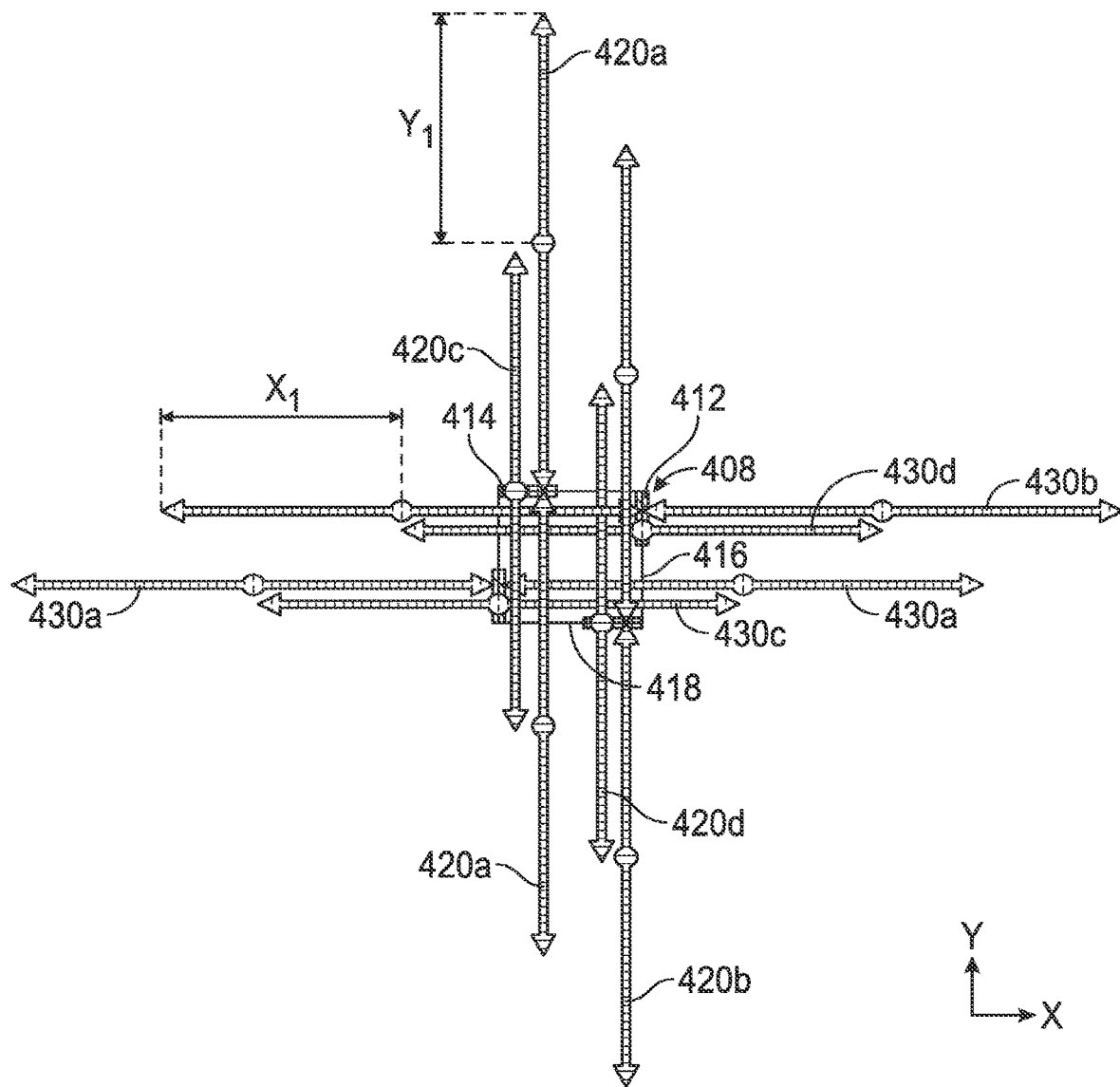
FIG. 4B is a more detailed illustration of one of the sub-arrays of the array of FIG. 4A with socket interconnect regions interspersed within the active memory array.

FIG. 4A illustrates a tile 404 of memory array divided into sixteen (4×4) patches 408, and FIG. 4B illustrates one of the patches 408 of the tile 404. From a frame of reference of the illustrated tile 404, FIGS. 4A and 4B illustrate four types of word lines. Word lines 430a are vertically connected at their respective central locations at or within one of inner word line socket interconnect regions 412 located in the upper and lower middle regions of the tile 404. Word lines 430b are vertically connected at their respective central locations at or within one of the word line socket interconnect regions 412 that are shifted in the x-direction, relative to the word line socket interconnect region connected to the word lines 430a, by about ¼ of a length of the word lines, e.g., by X112, and further shifted in the y-direction by about ¼ of a length of the digit lines, e.g., by Y112. Word lines 430c and 430d have vertical connection regions that are similarly shifted in the x-direction, relative to the word line socket interconnect region connected to the word lines 430a, by about ½ and ¾ of a length of the word lines (e.g., X1 and 1.5X1), respectively, and further shifted in the y-direction by about ½ and ¾ of a length of the digit lines (e.g., Yi and 1.5Y1), respectively. Similar to the word line socket interconnect regions of FIGS. 3A and 3B, at a given word line socket interconnect region 412 (FIG. 4B), some word lines are vertically connected (e.g., word lines 430c and 430d in FIG. 4B). Unlike the word line socket interconnect regions of FIGS. 3A and 3B, however, some word lines terminate at or within one of the word line socket interconnect regions 412 between adjacent patches (e.g., word lines 430a and 430b in FIG. 4B). In addition, unlike the tile 304 of FIG. 3A, the tile 404 does not include terminating word line regions between adjacent patches in the x-direction that are outside the word line socket interconnect regions 412. Instead, between adjacent patches but outside of the word line socket interconnect regions 412, the tile 404 includes pass-through word line regions 416, as described in more detail below with respect to FIG. 4C, through which word lines 430a and 430b pass without being contacted or terminated therein.

From a frame of reference of the illustrated tile 404, FIGS. 4A and 4B similarly illustrate four types of digit line lines. Digit lines 420a are vertically connected at their respective central locations at or within one of the inner digit line socket interconnect regions 414 located in the right and left regions of the tile 404. In a similar manner to the word lines, digit lines 420b, 420c and 420d are vertically connected at their respective central locations at or within one of the digit line socket interconnect regions 414 that are shifted in the x-direction, relative to the digit line socket interconnect region connected to the digit lines 420a, by increments of multiples of about 20% to about 30% of a length of the word lines, for instance about ¼, about ½ and about ¾ of a length of the word lines (e.g., X1/2, Xi and 1.5X1), respectively, and further shifted in the y-direction by increments of multiples of about 20% to about 30% of a length of the digit lines, for instance about ¼, about ½ and about ¾ of a length of the digit lines (e.g., Y1/2, Y1 and 1.5Y1), respectively. In the tile 404, each digit line 430a-430d spans between three and about five patches in the y-direction, for instance about four patches 408, while each word line 420a-420d spans between three and five patches in the x-direction, for instance about four patches 408.

In some embodiments, within a given patch 408, word lines 430a, 430b, 430c and 430d each comprise about one quarter of the number of word lines, and digit lines 420a, 420b, 420c and 420d each comprise about one quarter of the number of digit lines.

Figure 4C:
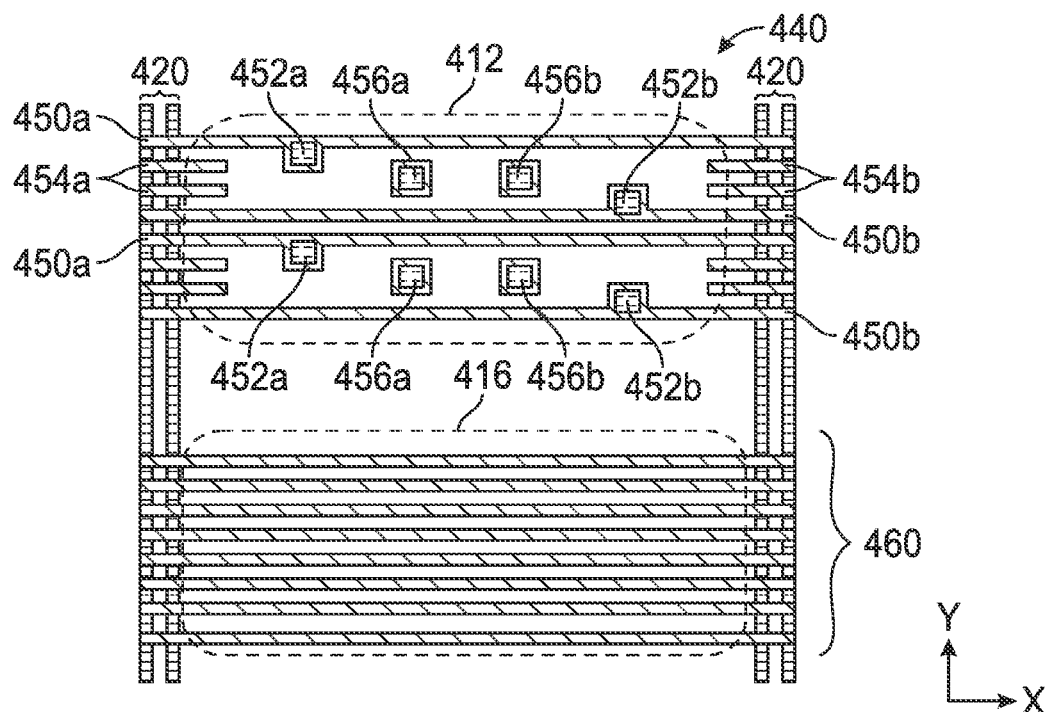
FIG. 4C is a close-up view of a gap region including a socket interconnect region of the array architecture of FIG. 4A.

FIG. 4C illustrates a detailed view of a boundary region 440 between main array regions of adjacent patches 408 in the x-direction, for the architecture described with respect to FIGS. 4A-4B. The boundary region 440 includes a word line socket interconnect region 412 and a pass-through word line region 416. Similar to FIG. 3C, the boundary region 440 is formed between main array regions of adjacent patches. Main array regions include memory cells formed at intersections between digit lines 420 and word lines 450a/450b, 454a/454b and 460. The word lines 450a and 450b that are connected within the word line interconnect socket region 412 can correspond to, e.g., the word line 430d of FIG. 4B that is connected at the word line socket interconnect region 412 at the upper right corner region of the patch 408, and word lines 454a and 454b can correspond to word line 430b of FIG. 4B that terminates at the upper right word line socket interconnect region 412 of the patch 408. The word lines 460 can correspond to word lines 430a and 430c of FIGS. 4A and 4B that pass through a pass-through word line region 416 that is below the upper right word line socket interconnect region 412. As can be seen, these word lines 430a and 430c that pass through are connected at another (lower left) word line socket interconnect region 412 of FIG. 4B. It will be appreciated that, for illustrative purposes only, only a few digit lines 420 and a few of each group of word lines 450a/450b, 454a/454b and 460 are illustrated, but in practice each of the word line socket interconnect region 412 and the pass-through word line region 416 can include additional word lines within each group.

Still referring to FIG. 4C, in the word line socket interconnect region 412, the vertical connection locations 452a and 452b of vertically connected word lines 450a and 450b are staggered, or offset in the x-direction relative to each other, in a similar manner to FIG. 3C. Unlike the word line socket interconnect region 312 illustrated above with respect to FIG. 3C, the word line socket interconnect region 412 includes terminating lines 454a and 454b that terminate within the word line socket interconnect region 412, instead of terminating lines being located within a terminating word line region that is outside the socket interconnect region 412.

Still referring to FIG. 4C, the terminating lines 454a include a first group of co-terminating lines and the terminating lines 454b include a second group of co-terminating lines that are aligned in the x-direction and interposed in the x-direction by a gap therebetween. The vertical connection locations 452a and 452b are formed within the gap. In addition, one or more of the vertical pass-through connections 456a and 456b vertically pass through the gap without contacting any of the word lines illustrated in FIG. 4C. Instead, the vertical pass-through connections 456a and 456b connect to word lines of a second deck (not shown), similar to word lines 24 described above with respect to FIG. 1B in a multi-deck memory array. Having terminating word lines, e.g., the pairs of terminating word lines 454a and 454b within the socket interconnect region allows for a relatively large room (2.5× of a pitch of the word lines in the y-direction) for the vertical pass-through connections 456a/456b. Furthermore, by choosing the number of terminating word lines 454a/454b between neighboring vertical connections 452a/452b in the y-direction and between neighboring vertical pass-through connections 456a/456b in the y-direction, corresponding connection locations to the underlying interconnect structures can be periodically repeated in the y-direction. For example, if the word lines have a first pitch (e.g., 2F) in the y-direction, the positions of the vertical connections 452a/452b and the vertical pass-through connections 456a/456b can be periodically repeated in the y-direction by an appropriate number of terminating word lines 454a/454b. In the illustrated embodiment, for example, the distance in the y-direction between the neighboring vertical connections is about four times the first pitch, or about 8F. Other periodicities are possible, for example greater than 6F in increments of 2F.

While not illustrated, the tile 404 includes boundary regions between two adjacent patches in the y-direction, each of which includes a digit line socket interconnect region and an adjacent pass-through digit line region, in an analogous manner as described above with respect to the boundary region 440 between two adjacent patches in the x-direction. As with the word lines, the digit line socket interconnect region (not shown) can have vertically connected digit lines whose positions can be staggered, terminating digit lines and vertical pass-through connections. As with the word lines, all lines pass through a pass-through digit line region without being vertically connected or terminated.

Figure 5A:
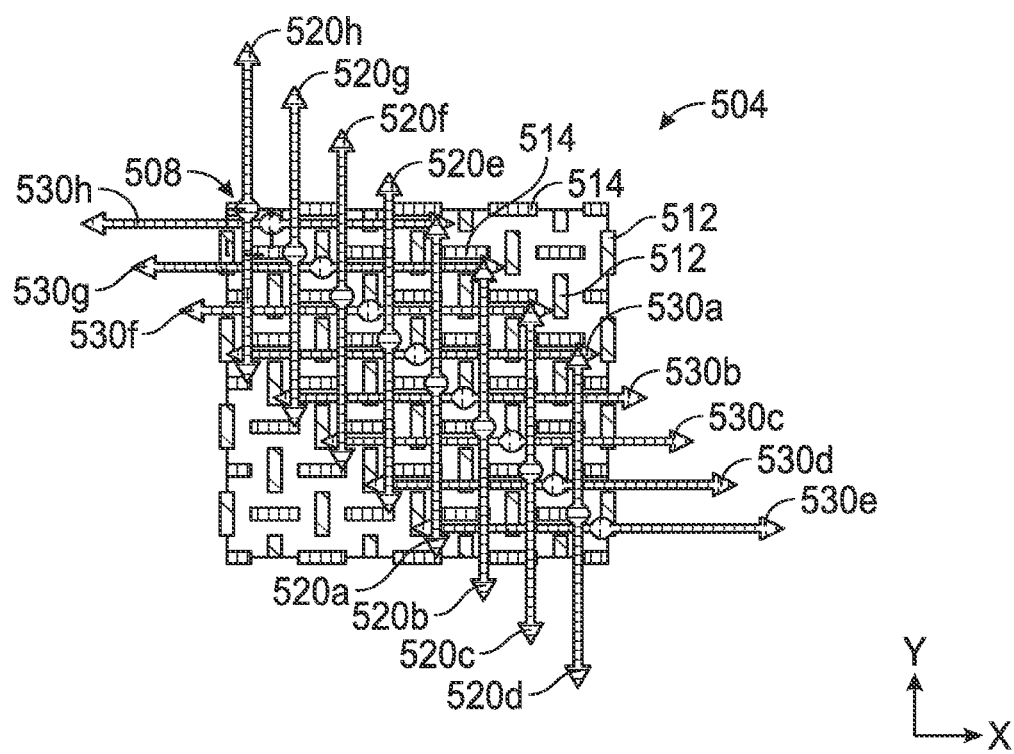
FIG. 5A is a schematic illustration of one array architecture having an active memory array partitioned into multiple sub-arrays with socket interconnect regions interspersed within the active memory array, according to an embodiment.
Figure 5B:
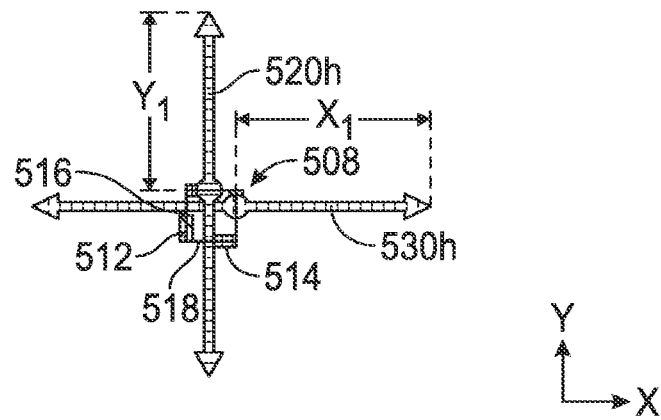
FIG. 5B is a more detailed view of one of the sub-arrays of the array of FIG. 5A with socket interconnect regions interspersed within the active memory array, according to an embodiment.

FIG. 5A illustrates a tile 504 of memory array divided into 64 (8×8) patches, and FIG. 5B illustrates one of the patches 508 of the tile 504, according to embodiments. The tile 504 is similar to the tile 404 of FIGS. 4A and 4B, except, from a frame of reference of the illustrated tile 504, FIGS. 5A and 5B illustrate eight types of word lines. In addition to the word lines 530a vertically connected at their respective central locations at or within one of the word line socket interconnect regions 512 located along the middle regions of the tile 502, the tile 504 includes word lines 530b, 530c, 530c, 530d, 530e, 530f and 530g that are vertically connected at their respective central locations at or within one of the word line socket interconnect regions 512 that are shifted in the x-direction, relative to the word line socket interconnect region connected to the word lines 530a, by multiples of about ⅛ of a length of the word lines, e.g., by X1/4, X1/2, 3X1/4, X1, −X1/4, −X1/2 and −3X1/4, respectively, and further shifted in the y-direction by about ⅛ of a length of the digit lines, e.g., by Y1/4, Y1/2, 3Y1/4, Y1, −Y1/4, −Y1/2 and −3Y1/4, respectively. Similar to the word line socket interconnect regions of FIGS. 4A and 4B, at a given word line socket interconnect region 512, some word lines are vertically connected, while some word lines terminate at or within one of the word line socket interconnect regions 512 between adjacent patches. However, as described more in detail with respect to FIG. 5C, unlike the tile 404 of FIG. 4A, the tile 504 not only includes connected and terminating word lines that connect and terminate in a word line socket interconnect region 512, but additionally includes pass-through word lines within the same socket interconnect region 512.

From a frame of reference of the illustrated tile 504, FIGS. 5A and 5B similarly illustrate eight types of digit lines. In addition to the digit lines 520a vertically connected at their respective central locations at or within one of the digit line socket interconnect regions 514 located along the middle regions of the tile 504, the tile 504 includes digit lines 520b, 520c, 520c, 520d, 520e, 520f and 520g that are vertically connected at their respective central locations at or within one of the digit line socket interconnect regions 514 that are shifted in the x-direction, relative to the word line socket interconnect region 514 connected to the word lines 530a, by increments of multiples of about 5% to about 20% of a length of the word lines or increments of multiples of about 10% to about 15% of a length of the word lines, for instance of about ⅛ of a length of the word lines (e.g., by X114, X112, 3X114, X1, −X114, −X112 and −3X114, respectively), and further shifted in the y-direction by increments of multiples of about 5% to about 20% of a length of the digit lines or increments of multiples of about 10% to about 15% of a length of the digit lines, for instance about ⅛ of a length of the digit lines (e.g., by Y114, Y112, 3Y1/4, Y1, −Y1/4, −Y112 and −3Y114, respectively). In the tile 504, each digit line 520a-h spans between six and ten patches in the y-direction, or between seven and eight patches, for instance about eight patches 508, while each word line 530a-h spans between six and ten patches in the x-direction, or between seven and eight patches, for instance about eight patches 508. Correspondingly, each digit line 520a-h spans across a length corresponding to between five and nine adjacent digit line socket interconnect regions 514 in the y-direction, or between six and eight digit line socket interconnect regions 514, for instance about seven digit line socket interconnect regions 514, while each word line 530a-h spans across a length corresponding to between five and nine adjacent word line socket interconnect regions 512 in the x-direction, or between six and eight word line socket interconnect regions 512, for instance about seven word line socket interconnect regions 512.

In some embodiments, within a given patch 508, digit lines 520a-h each comprise about one eighth (⅛) of the number of word lines, and word lines 530a-h each comprise about one eighth (⅛) of the number of digit lines.

Figure 5C:
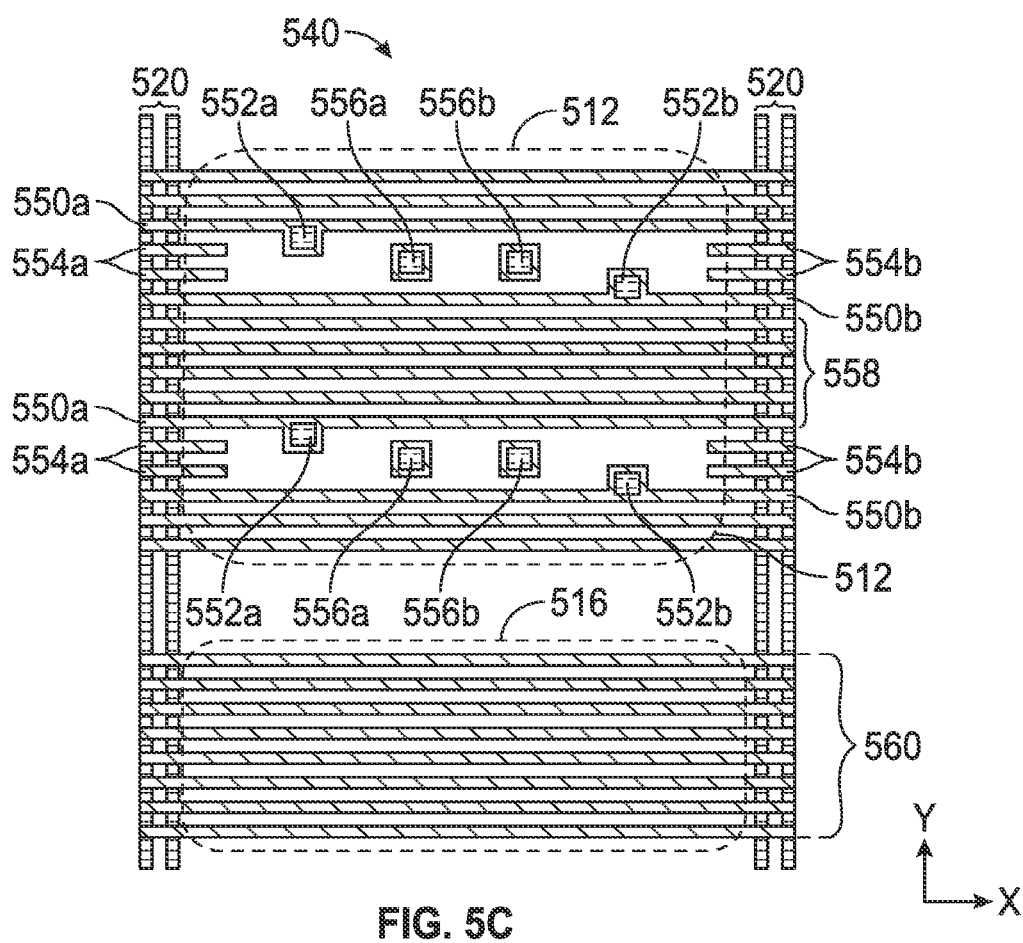
FIG. 5C is a close-up view of a gap region including a socket interconnect region of the array architecture of FIG. 5A, according to an embodiment.

FIG. 5C illustrates a detailed view of a boundary region 540 between main array regions of adjacent patches 508 in the x-direction, for the architecture of FIGS. 5A-5B. The boundary region 540 includes a word line socket interconnect region 512 and a pass-through word line region 516. Similar to FIG. 4C, the boundary region 540 is formed between main array regions of adjacent patches, in which memory cells are formed at intersections between digit lines 520 and word lines 550a/550b, 554a/554b, 558 and 560.

Still referring to FIG. 5C, in the word line socket interconnect region 512, the vertical connections are made at connection locations 552a and 552b of vertically connected word lines 550a and 550b, where the connection locations are staggered, or offset in the x-direction relative to each other, in a similar manner to FIG. 4C. In addition, a plurality of terminating lines 554a/554b terminate at or within the word line socket interconnect region 512. In the illustrated embodiment, the terminating lines 554a/554b include at least two lines that co-terminate. Unlike the word line socket interconnect region illustrated above with respect to FIG. 4C, the word line socket interconnect region 512 includes pass-through word lines 558 that pass-through the word line socket interconnect region 512 without being vertically connected and without being terminated at the socket interconnect region 512. The pass-through word lines 558 are in addition to pass-through word lines 560 that pass through the pass-through word line region 516 that is vertically adjacent and located outside of the word line socket interconnect region 512. The pass-through word lines 558 are distinguishable from the pass-through word lines 560 by the location of their vertical connection. The pass-through word lines 558 of the illustrated embodiment are located between connected word lines 550a and 550b in the same socket interconnect region 512, and also between terminated word lines 554b or 554a in the same socket interconnect region 512.

Still referring to FIG. 5C, similar to the arrangement described above with respect to FIG. 4C, the terminating lines 554a include a first group of co-terminating lines and the terminating lines 554b include a second group of co-terminating lines that are aligned in the x-direction and interposed in the x-direction by a gap therebetween. The vertical connection locations 552a and 552b are formed within the gap. In addition, one or more of vertical pass-through connections 556a and 556b vertically pass through the gap without contacting any of the word lines illustrated in FIG. 5C. Instead, the vertical pass-through connections 556a and 556b connect to word lines of a second deck (not shown), in a similar manner to as described above with respect to FIG. 4C. Similar to as described above with respect to FIG. 4C, having terminating word lines, e.g., the pairs of terminating word lines 554a and 554b within the socket interconnect region allows for a relatively large room (2.5× of a pitch of the word lines in the y-direction) for the vertical pass-through connections 556a/556b. Furthermore, by choosing the number of pass-through word lines 558 and terminating word lines 554a/554b between neighboring vertical connections 552a/552b in the y-direction and between neighboring vertical pass-through connections 556a/556b in the y-direction, corresponding connection locations to the underlying interconnect structures can be periodically repeated in the y-direction. For example, if the word lines have a first pitch (e.g., 2F) in the y-direction, the positions of the vertical connections 552a/552b can be periodically repeated in the y-direction by an appropriate number of intervening pass-through word lines 558 and terminating word lines 554a/554b. In the illustrated embodiment, for example, the distance in the y-direction between the neighboring vertical connections 552a/552b and between neighboring vertical pass-through connections 556a/556b is about eight times the first pitch, or about 16F. Other periodicities are possible, for example greater than 6F in increments of 2F.

FIG. 5D is a detailed view of multiple boundary regions 540a of adjacent patches 508 in the x-direction, for illustration of relative locations of termination, vertical connection and pass-through locations of the various lines described above with respect to FIG. 5C. FIG. 5D illustrates a plurality of word lines 530a-530h, wherein each word line extends in the x-direction and is vertically connected at a different socket interconnect region 512 (two labeled 512a and 512b in FIG. 5D) that are shifted with respect to each other. In FIG. 5D, while a single word line is shown for each of the word lines 530a-530h, each of the word lines 530a-530h can represent a plurality (e.g., 2, 4, 8, etc.) of word lines that co-terminate and are vertically connected at the same socket interconnect region. It is noted the word lines 530a-530h are vertically connected at a word line socket interconnect region of one of eight consecutive patches 508 that are shifted with respect to one another in the x-direction but not in the y-direction. Thus, like numeral designations of word lines between FIGS. 5A and 5D do not necessarily correspond to one another. An amount of the shift in the x-direction of a first socket interconnect region 512a (corresponding to a vertical connection location of the word line 530a) relative to a second socket interconnect region 512b (corresponding to a vertical connection location of the word line 530b) is between about 1/32 and about 1/4 of a length of the word lines, or between is between about 1/16 and about 3/16 of the length of the word lines, for instance about 1/8 of the length of the word lines. Referring to FIGS. 5C and 5D, vertically connected word lines 550a and 550b of FIG. 5C can correspond to one of the word lines 530a of FIG. 5D that are connected at word line socket interconnect regions 516a, and terminating word lines 554a and 554b of FIG. 5C can correspond to one of the word lines 530e that terminate at the word line socket interconnect regions 512a (FIG. 5D).

Referring to FIG. 5D, it will be appreciated that the pass-through word lines that pass through a word line socket interconnect region (e.g., 512a) are distinguishable from pass-through word lines that pass through a pass-through word line region (e.g., 516a) by their respective vertical connection locations. Referring to the socket interconnect region 512 in which the word line 530e is centrally connected, word lines 530c and 530g that pass through the socket interconnect region 512a are connected two patches away, e.g., between about 3/16 and about 5/16 of a length of the word lines (e.g., between about X1/4 and about 3X1/4) away, for instance about 1/4 of a length of the word lines (e.g., X1/2) away, from the socket interconnect region 512a of the word line 530e. In contrast, word lines 540b, 540d, 540f and 540h that pass through the pass-through word line region 516a below the socket interconnect region 512a in which the word line 530e is centrally connected are connected at distances that are different from the pass-through word lines 558, e.g., different than two patches away, e.g., one or three patches away, corresponding to about 1/8 and about 3/8 of a length of the word lines (e.g., X1/4 and 3X1/4), respectively, from the socket interconnect region 512a in which the word line 530e is centrally connected.

While not illustrated, the tile 504 includes boundary regions between two adjacent patches in the y-direction, each of which includes a digit line socket interconnect region and an adjacent pass-through digit line region, in an analogous manner as described above with respect to the boundary region 540 between two adjacent patches in the x-direction. As with the word lines, the digit line socket interconnect region can have vertically connected digit lines (not shown) whose positions can be staggered, have terminating digit lines and vertical pass-through connections and have pass-through digit lines. As with the word lines, all lines pass-through a given pass-through digit line socket interconnect region without being vertically connected or terminated.

It will be appreciated that having the various arrangements described above with respect to FIGS. 4A-3C, 4A-4C and 5A-5D is more than mere design choice. Location for the driver circuitry affects performance of the memory and requires substantial architectural changes, as explained below with respect to FIG. 6A-6C, in the array and metallization layers.

It will be appreciated that for the various arrangements described above with respect to FIGS. 2A-2B, 3A-3C, 4A-4C and 5A-5D, sometimes referred to as "quilt architectures," substantial cost reduction can be achieved by fitting all drivers under the array, sharing the same footprint as memory cells in a densely packed manner, as compared to arrangements in which drivers are located at or outside the periphery of the array. The various arrangements place all drivers under the array by breaking up the driver groups into smaller pieces and locating the sockets in a distributed manner. In addition, by driving the electrode lines from their midpoints may confer advantages to drivers due to reduction in IR drop and RC delay as compared to conventional techniques, because the farthest cell along the line is about half the distance as for the farthest cell for electrode lines driven from their endpoints, which can be of significant benefit to certain types of cross-point memory cell technologies. Benefits may be manifested in relaxed transistor requirements, circuit complexity, process complexity or circuit area for the driver circuits, as examples.

Furthermore, the architectures of FIGS. 3A-3C, 4A-4C and 5A-5D permit breaking the device driver groups, the array, and socket interconnect regions into successively smaller pieces, which can be associated with successively relaxed pitch requirement of interconnect metal layers vertically adjacent the electrode lines, resulting in successively increasing cost advantage, as described below with respect to FIGS. 6A-6C. In addition, successively relaxed pitch requirement can be associated with successive lower resistance and RC delays associated with the interconnect metal layers and other connected structures such as vias. In the following, the advantageous relaxation of lithographic pitch of the interconnect levels is illustrated with reference to FIG. 5D and FIGS. 6A-6C. In the illustrated examples, a plurality of electrode lines, e.g., word lines, are formed at a word line layer level and extend in a first lateral direction (e.g., x-direction in FIG. 5D) to traverse a plurality of array patches and a plurality of boundary regions, wherein each boundary region includes one or more socket interconnect regions (e.g., 512a in FIG. 5D) and one or more pass-through electrode regions (e.g., 516a in FIG. 5D). Each patch is formed between socket interconnect regions that are adjacent in a lateral direction (e.g., x-direction). Vertical connections to the electrode lines are made in the socket interconnect regions, but not in the patch regions between socket interconnect regions. Each of the electrode lines, e.g., word lines, is vertically connected to a metallization level formed at a second vertical level, e.g., a vertically adjacent interconnect level, at one of the socket interconnect regions. By staggering connection positions of successive electrode lines so that they are laterally offset from each other (e.g., in the x-direction in FIG. 5D), and having the connection positions periodically repeat in a second lateral direction (e.g., y-direction in FIG. 5D), the lithographic tolerance requirements of the connection between the word line layer level and the vertically adjacent interconnect level can be relaxed. The amount of relaxation can be customized based on the periodicity of the periodically repeating positions, whose periodicity is which is greater than a pitch of the electrode lines multiplied by a number of patches traversed by each electrode line. For example, in FIGS. 6A, 6B and 6C, the number of patches traversed by the electrode lines is 2 in FIG. 6A, 4 in FIG. 6B and 8 in FIG. 6C, which relaxes the lithographical pitches of the vertically adjacent interconnect level to 4F, 8F and 16F, respectively, wherein the pitch of the word lines is 2F. The concepts described herein can be extended to vertical connections between word lines and the vertically adjacent interconnect level connections, and to vertical connections between bit lines/word lines and interconnect levels that are not immediately adjacent.

Figure 6B:
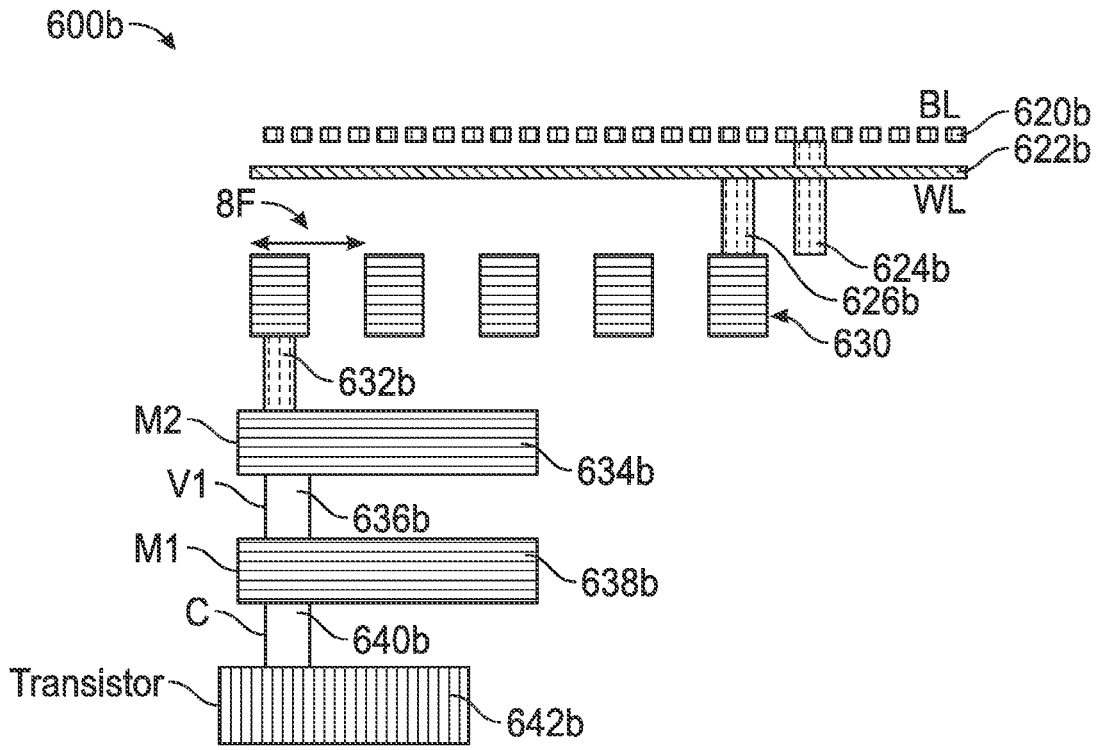
FIG. 6B is a cross-sectional view of a memory device illustrating vertical connections and metallization structures for the memory array architecture illustrated in FIGS. 4A-4C, according to another arrangement.
Figure 6C:
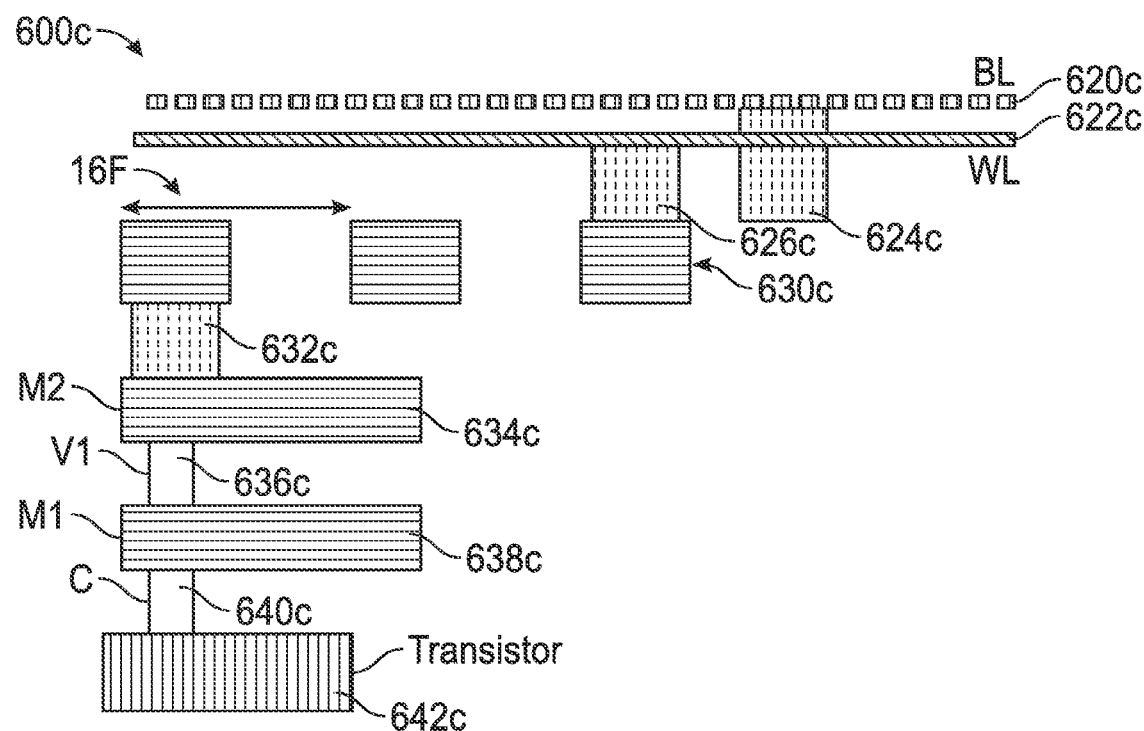
FIG. 6C is a cross-sectional view of a memory device illustrating vertical connections and metallization structures for the memory array architecture illustrated in FIGS. 5A-5D, according to an embodiment.

FIGS. 6A, 6B and 6C are cross-sectional illustrations of memory devices 600a, 600b and 600c, corresponding to memory devices having tiles 304, 404 and 504 of memory array described above with respect to FIGS. 3A-3C, 4A-4C and 5A-5D, respectively. Each of the memory devices 600a, 600b and 600c has a memory array which includes a respective digit line (DL) layer, which is referred to herein as a bit line (BL) layer 620a, 620b and 620c, and a respective word line (WL) layer 622a, 622b, and 622c, and memory cells (not shown for clarity) formed at the intersections of word lines and digit lines that cross each other. Each of the memory devices 600a-600c has a respective transistor level 642a, 642b and 642c, which includes driver transistors. The transistor levels 642a, 642b and 642c are connected to respective level 1 metallization (M1) levels 638a, 638b and 638c through a respective contact via structure 640a, 640b and 640c, and respective level 2 metallization (M2) levels 634a, 634b and 634c are connected to respective M1 levels 638a, 638b and 638c through respective M1-M2 via structures 636a, 636b and 636c. The arrays of each of the memory devices 600a, 600b and 600c and the respective M2 levels 634a, 634b and 634c are connected through an interconnect level 630a, 630b and 630c. The function of the interconnect levels 630a, 630b and 630c is to electrically connect the array with the transistors through one or more metallization levels (e.g., M1 and M2). In some embodiments, an interconnect level may itself be a metallization layer. On the array side, the interconnect levels 630a, 630b and 630c are connected to the respective BL levels 620a, 620b and 630c through respective digit line (BL) layer array vias 624a, 624b and 624c, and are connected to the respective WL levels 622a, 622b and 622c through respective word line (WL) layer array vias 626a, 626b and 626c. On the metallization side, the interconnect levels 630a, 630b and 630c are connected to the respective M2 levels 634a, 634b and 634c through respective interconnect vias 632a, 632b and 632c. In FIGS. 6A, 6B and 6C, for clarity of description only, only one conductive structure corresponding to each of the various via layers is illustrated.

Forming vertical connections to electrode lines as using one of socket interconnect designs illustrated in FIGS. 3C, 4C and 5C may affect design rules for one or more of the BL layer array vias 624a-624c, the WL layer array vias 626a-626c, the interconnect levels 630a-630c and the interconnect vias 632a-632c.

For example, in designing a socket interconnect region similar to the word line socket interconnect region 312 described above with respect to FIG. 3C, if a pitch of electrode lines, e.g., the word lines and the digit lines, is represented as 2F, where F is a minimum lithographic feature size, the vertical connection locations 352a or 352b has a periodicity in the y-direction of 4F. As a result, in order to make connections to each of the vertical connection locations 352a and 352b in the word line socket region 312 of FIG. 3C, metal lines having a pitch of 4F would typically be employed at the interconnect level 630a of the device 600a of FIG. 6A. In addition, via connections to such metal lines would generally follow similar or same feature size design rules. Thus, with reference to FIG. 6A, a feature size design rule for patterning the BL layer array via 624a, the WL layer array via 626a, the interconnect level 630a and the interconnect via 632a would be about 4F, which is twice the pitch of the array electrode lines. As an illustrative example, for an array electrode pitch of 32 nm, pitch of metal lines of the interconnect level 630a would be about 64 nm. This feature size design rule can be substantially relaxed, however, by designing a socket interconnect region similar to the word line socket interconnect regions 412 (FIG. 4C) and 512 (FIG. 5C), as described below.

Referring to FIG. 6B, in designing a socket interconnect region similar to the word line socket interconnect region 412 described above with respect to FIG. 4C, for an array electrode line pitch of 2F, each of the vertical connection locations 452a and 452b (FIG. 4C) has a periodicity in the y-direction of 8F. In addition, each of the vertical pass-through connections 456a and 456b (FIG. 4C) has a periodicity in the y-direction of 8F. As a result, for similar reasons as described above with respect to FIG. 6A, to connect the vertical connection locations 452a and 452b and/or the vertical pass-through connections 456a and 456b at the interconnect level 630b, metal lines having a pitch of greater than 6F, e.g., 8F (4× the pitch of the array electrode lines), can be employed, which would correspondingly constrain feature sizes of the BL layer array via 624b, the WL layer array via 624b, the interconnect level 630b and the interconnect via 632b. As an illustrative example, for an array electrode pitch of 32 nm, pitch of metal lines of the interconnect level 630a could be greater than 3× this pitch, or greater than about 96 nm, e.g., 4× the array pitch (about 128 nm). This feature size design rule can be further relaxed by designing a socket interconnect region similar to the word line socket interconnect region 512 of FIG. 5C, as described below.

Referring to FIG. 6C, in designing a socket interconnect region similar to the word line socket interconnect region 512 described above with respect to FIG. 5C, for an array electrode line pitch of 2F, the vertical connection locations 552a or 552b has a periodicity in the y-direction of 16F. In addition, the vertical pass-through connections 556a and 556b also has a periodicity in the y-direction of 16F. As a result, for similar reasons as described above with respect to FIG. 6B, to connect each of the vertical connection locations 552a and 552b and/or the each of vertical pass-through connections 556a and 556b at the interconnect level 630c, metal lines having a pitch of greater than 8F, and particularly greater than 12F, e.g., about 16F (which is 8× the pitch of the array electrode lines), could be employed, which would correspondingly constrain feature sizes of the BL layer array via 624c, the WL layer array via 624c, the interconnect level 630c and the interconnect via 632c. As an illustrative example, for an array electrode pitch of 32 nm, pitch of metal lines of the interconnect level 630a could be greater than 6× this pitch, or greater than about 192 nm, e.g., 8× the array pitch (about 256 nm). It will be appreciated that the increase in the pitch of the metal lines of the interconnect level by greater than three times the pitch of the electrode lines as described above can enable substantial cost savings by, for example, relaxing the demands on lithography relative to critical lithography processes for several structures, such as metal lines of the interconnect level, digit line (BL) layer array vias, word line (WL) layer array vias and interconnect vias. For example, when the pitch of metal lines is 192 nm, 193 nm UV excimer laser may be employed for patterning without pitch doubling, and when the pitch of metal lines is 256 nm, 248 nm UV excimer laser may be employed for patterning without pitch doubling.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of appended claims, and equivalents thereof.

What is claimed is:

1. An apparatus, comprising:
a first plurality of electrode lines at a first level, the first plurality of electrode lines extending in a first direction that is parallel with the first level;
a second plurality of electrode lines at the first level, the second plurality of electrode lines extending in a second direction that is parallel with the first level and crossing the first direction;
a first boundary region connected to the first plurality of electrode lines, wherein each electrode line of the first plurality is connected within the first boundary region to one of a plurality of metal lines of a second level that is located above or below the first level in a third direction perpendicular to the first direction and perpendicular to the second direction; and
a second boundary region connected with the second plurality of electrode lines.

2. The apparatus of claim 1, wherein the plurality of metal lines is electrically connected with a transistor level above or below the second level in the third direction.

3. The apparatus of claim 1, wherein the second plurality of electrode lines are terminated within the second boundary region.

4. The apparatus of claim 1, further comprising:
memory cells positioned at intersections between the first plurality of electrode lines and the second plurality of electrode lines.

5. The apparatus of claim 4, wherein the first boundary region and the second boundary region are exclusive of the intersections between the first plurality of electrode lines and the second plurality of electrode lines.

6. The apparatus of claim 1, further comprising:
a third plurality of electrode lines extending in the first direction at the first level, wherein the third plurality of electrode lines pass through the first boundary region without being connected in the first boundary region; and
a third boundary region connected to the third plurality of electrode lines, wherein each electrode line of the third plurality is connected within the third boundary region to one of the plurality of metal lines of the second level.

7. The apparatus of claim 1, further comprising:
a fourth plurality of electrode lines extending in the second direction at the first level, wherein the fourth plurality of electrode lines pass through the second boundary region without being connected in the second boundary region; and
a fourth boundary region connected to the fourth plurality of electrode lines, wherein the fourth plurality of electrode lines are terminated within the fourth boundary region.

8. An apparatus, comprising:
a plurality of conductive lines formed at a first level that extend in a first direction and have a pitch in a second direction crossing the first direction, wherein the plurality of conductive lines are connected to interconnect structures formed at a second level above or below the first level in a third direction perpendicular to the first direction and perpendicular to the second direction, the plurality of conductive lines comprising:
a plurality of contacted lines connected to at least one interconnect structure at a boundary region by a connector;
a plurality of terminating lines connected to the boundary region; and
a plurality of lines that pass through the boundary region.

9. The apparatus of claim 8, wherein:
the plurality of contacted lines are connected to the at least one interconnect structure at a socket interconnect region in the boundary region;

the plurality of terminating lines are terminated within a terminating line region in the boundary region; and the plurality of lines pass through a pass-through line region in the boundary region without being connected to the at least one interconnect structure at the socket interconnect region and without being terminated within the terminating line region.

10. The apparatus of claim 9, wherein the pass-through line region is adjacent to the socket interconnect region, the terminating line region, or both, in the boundary region.

11. The apparatus of claim 8, wherein the plurality of lines that pass through the boundary region are connected to the at least one interconnect structure at a second boundary region by a second connector.

12. The apparatus of claim 8, wherein the plurality of lines that pass through the boundary region are terminated within a third boundary region.

13. The apparatus of claim 8, wherein the connector connecting the plurality of contacted lines to the at least one interconnect structure comprises a plurality of vertically connected lines extending in the third direction.

14. The apparatus of claim 8, further comprising:

a plurality of memory arrays including a first memory array and a second memory array, wherein the boundary region is between the first memory array and the second memory array in the first direction, and wherein the plurality of conductive lines are word lines or digit lines of the first memory array and a second plurality of conductive lines are word lines or digit lines of the second memory array.

15. The apparatus of claim 14, wherein the second plurality of conductive lines are formed at the first level, extend in the first direction, and have a second pitch in the second direction crossing the first direction, wherein the second plurality of conductive lines are connected to the interconnect structures formed at the second level above or below the first level in the third direction, the second plurality of conductive lines comprising:

a second plurality of contacted lines connected to the at least one interconnect structure at the boundary region by a second connector;

a second plurality of terminating lines connected to the boundary region; and a second plurality of lines that pass through the boundary region.

16. The apparatus of claim 8, further comprising:

memory cells positioned at intersections between the plurality of conductive lines and a plurality of intersecting conductive lines, the plurality of intersecting conductive lines formed at the first level and extending in the second direction crossing the first direction.

17. The apparatus of claim 16, wherein the boundary region is exclusive of the intersections between the plurality of conductive lines and the plurality of intersecting conductive lines.

18. An apparatus, comprising:

a plurality of electrode lines formed at a first level and traversing a plurality of memory cell regions and a plurality of boundary regions, each memory cell region formed between boundary regions in a first direction, wherein the plurality of electrode lines include digit lines that are parallel with the first level and word lines that are parallel with the first level and intersect in the plurality of memory cell regions, wherein each electrode line is coupled with a second level using at least one boundary region, wherein the second level is located above or below the first level in a second direction perpendicular to the first direction.

19. The apparatus of claim 18, wherein each boundary region of the plurality of boundary regions comprises a socket interconnect region, a terminating line region, a pass-through line region, or any combination thereof.

20. The apparatus of claim 18, wherein boundary regions of the plurality of boundary regions are exclusive of intersections of the plurality of electrode lines.

* * * * *